US008927308B2

(12) United States Patent
Pang et al.

(10) Patent No.: US 8,927,308 B2
(45) Date of Patent: Jan. 6, 2015

(54) METHOD OF FORMING BUS LINE DESIGNS FOR LARGE-AREA OLED LIGHTING

(75) Inventors: Huiqing Pang, Newtown, PA (US); Peter Levermore, Lambertville, NJ (US); Emory Krall, Philadelphia, PA (US); Kamala Rajan, Newton, PA (US); Ruiqing (Ray) Ma, Morristown, NJ (US); Paul E. Burrows, Kennewick, WA (US)

(73) Assignee: Universal Display Corporation, Ewing, NJ (US)

( * ) Notice: Subject to any disclaimer, the term of this patent is extended or adjusted under 35 U.S.C. 154(b) by 717 days.

(21) Appl. No.: 13/106,733

(22) Filed: May 12, 2011

(65) Prior Publication Data
US 2012/0286298 A1 Nov. 15, 2012

(51) Int. Cl.
H01L 51/10 (2006.01)
H01L 51/52 (2006.01)
H01L 51/00 (2006.01)

(52) U.S. Cl.
CPC ......... *H01L 51/5228* (2013.01); *H01L 51/0068* (2013.01); *H01L 51/008* (2013.01); *H01L 51/5203* (2013.01); *H01L 51/0067* (2013.01); *H01L 51/0058* (2013.01); *H01L 2051/0063* (2013.01); *H01L 51/0092* (2013.01); *H01L 51/0072* (2013.01); *H01L 51/5212* (2013.01); *H01L 51/0046* (2013.01); *H01L 2251/5361* (2013.01)
USPC .......... 438/34; 438/99; 257/88; 257/E33.062; 257/E33.066; 313/505

(58) Field of Classification Search
USPC ............. 257/88, E33.062, E33.066; 313/505; 438/34, 99
See application file for complete search history.

(56) References Cited

U.S. PATENT DOCUMENTS 4,769,292 A 9/1988 Tang et al.
5,061,569 A 10/1991 VanSlyke et al.
(Continued)

FOREIGN PATENT DOCUMENTS

EP 0650955 5/1995
EP 1725079 11/2006
(Continued)

OTHER PUBLICATIONS

The OSADirect Newsletter, "Fraunhofer IPMS develops Tabola OLED lighting for customer evaluation and to showcase foundry capabilities," published Oct. 18, 2010, accessed May 31, 2013, accessed at http://www.osa-direct.com/osad-news/364.html.
(Continued)

*Primary Examiner* — Alexander Sofocleous
*Assistant Examiner* — John P Dulka
(74) *Attorney, Agent, or Firm* — Morris & Kamlay LLP

(57) ABSTRACT

Systems, and methods for the design and fabrication of OLEDs, including large-area OLEDs with metal bus lines, are provided. For a given panel area dimension, target luminous emittance, OLED device structure and efficiency (as given by the JVL characteristics of an equivalent small area pixel), and electrical resistivity and thickness of the bus line material and electrode onto which the bus lines are disposed, a bus line pattern may be designed such that Fill Factor (FF), Luminance Uniformity (U) and Power Loss (PL) may be optimized. One general design objective may be to maximize FF, maximize U and minimize PL. Another approach may be, for example, to define minimum criteria for U and a maximum criteria for PL, and then to optimize the bus line layout to maximize FF. OLED panels including bus lines with different resistances (R1) along a length of the bus line are also described.

32 Claims, 15 Drawing Sheets

(56) References Cited

U.S. PATENT DOCUMENTS

| | | |
|---|---|---|
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,407,408 B1 | 6/2002 | Zhou et al. |
| 6,468,819 B1 | 10/2002 | Kim et al. |
| 6,528,187 B1 | 3/2003 | Okada |
| 6,664,730 B2 | 12/2003 | Weaver |
| 6,687,266 B1 | 2/2004 | Ma et al. |
| 6,771,343 B2 * | 8/2004 | Kim et al. ............... 349/141 |
| 6,835,469 B2 | 12/2004 | Kwong et al. |
| 6,921,915 B2 | 7/2005 | Takiguchi et al. |
| 7,087,321 B2 | 8/2006 | Kwong et al. |
| 7,090,928 B2 | 8/2006 | Thompson et al. |
| 7,113,241 B2 * | 9/2006 | Hanaoka ................. 349/139 |
| 7,154,114 B2 | 12/2006 | Brooks et al. |
| 7,230,107 B1 | 6/2007 | Herron et al. |
| 7,250,226 B2 | 7/2007 | Tokito et al. |
| 7,279,704 B2 | 10/2007 | Walters et al. |
| 7,332,232 B2 | 2/2008 | Ma et al. |
| 7,338,722 B2 | 3/2008 | Thompson et al. |
| 7,393,599 B2 | 7/2008 | Thompson et al. |
| 7,396,598 B2 | 7/2008 | Takeuchi et al. |
| 7,431,968 B1 | 10/2008 | Shtein et al. |
| 7,445,855 B2 | 11/2008 | Mackenzie et al. |
| 7,534,505 B2 | 5/2009 | Lin et al. |
| 7,599,014 B2 * | 10/2009 | Shih ....................... 349/43 |
| 7,623,210 B2 * | 11/2009 | Kaida et al. ............. 349/138 |
| 8,519,920 B2 * | 8/2013 | Jeong ..................... 345/83 |
| 8,592,237 B2 * | 11/2013 | Lee et al. ................ 438/34 |
| 2002/0034656 A1 | 3/2002 | Thompson et al. |
| 2002/0134984 A1 | 9/2002 | Igarashi |
| 2002/0158242 A1 | 10/2002 | Son et al. |
| 2003/0138657 A1 | 7/2003 | Li et al. |
| 2003/0152802 A1 | 8/2003 | Tsuboyama et al. |
| 2003/0162053 A1 | 8/2003 | Marks et al. |
| 2003/0175553 A1 | 9/2003 | Thompson et al. |
| 2003/0230980 A1 | 12/2003 | Forrest et al. |
| 2004/0036077 A1 | 2/2004 | Ise |
| 2004/0137267 A1 | 7/2004 | Igarashi et al. |
| 2004/0137268 A1 | 7/2004 | Igarashi et al. |
| 2004/0174116 A1 | 9/2004 | Lu et al. |
| 2005/0025993 A1 | 2/2005 | Thompson et al. |
| 2005/0112407 A1 | 5/2005 | Ogasawara et al. |
| 2005/0238919 A1 | 10/2005 | Ogasawara |
| 2005/0244673 A1 | 11/2005 | Satoh et al. |
| 2005/0260441 A1 | 11/2005 | Thompson et al. |
| 2005/0260449 A1 | 11/2005 | Walters et al. |
| 2006/0008670 A1 | 1/2006 | Lin et al. |
| 2006/0202194 A1 | 9/2006 | Jeong et al. |
| 2006/1024027 | 10/2006 | Adamovich at al. |
| 2006/0246756 A1 * | 11/2006 | Winings et al. ......... 439/108 |
| 2006/0251923 A1 | 11/2006 | Lin et al. |
| 2006/0263635 A1 | 11/2006 | Ise |
| 2006/0280965 A1 | 12/2006 | Kwong et al. |
| 2007/0190359 A1 | 8/2007 | Knowles et al. |
| 2007/0278938 A1 | 12/2007 | Yabunouchi et al. |
| 2008/0015355 A1 | 1/2008 | Schafer et al. |
| 2008/0018221 A1 | 1/2008 | Egen et al. |
| 2008/0106190 A1 | 5/2008 | Yabunouchi et al. |
| 2008/0124572 A1 | 5/2008 | Mizuki et al. |
| 2008/0220265 A1 | 9/2008 | Xia et al. |
| 2008/0297033 A1 | 12/2008 | Knowles et al. |
| 2009/0008605 A1 | 1/2009 | Kawamura et al. |
| 2009/0009065 A1 | 1/2009 | Nishimura et al. |
| 2009/0017330 A1 | 1/2009 | Iwakuma et al. |
| 2009/0030202 A1 | 1/2009 | Iwakuma et al. |
| 2009/0039776 A1 | 2/2009 | Yamada et al. |
| 2009/0045730 A1 | 2/2009 | Nishimura et al. |
| 2009/0045731 A1 | 2/2009 | Nishimura et al. |
| 2009/0101870 A1 | 4/2009 | Prakash et al. |
| 2009/0108737 A1 | 4/2009 | Kwong et al. |
| 2009/0115316 A1 | 5/2009 | Zheng et al. |
| 2009/0165846 A1 | 7/2009 | Johannes et al. |
| 2009/0167162 A1 | 7/2009 | Lin et al. |
| 2009/0179554 A1 | 7/2009 | Kuma et al. |
| 2011/0141421 A1 * | 6/2011 | Lee et al. ................ 349/138 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2008056746 | 5/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |

OTHER PUBLICATIONS

Tung, Y. et al., "Highly Efficient Red Phosphorescent Osmium(II) Complexes for OLED Applications," *Organometallics*, vol. 23, No. 15, pp. 3745-3748 (2004).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDAT), as Hole-Transport Materials," *Adv. Mater.*, 6(9)677-679 (1994).

Paulose, Betty Marie Jennifer S. et al., "First Examples of Alkenyl Pyridines as Organic Ligands for Phosphorescent Iridium Complexes," *Adv. Mater.*, 16(22):2003-2007 (2004).

Tung, Yung-Liang et al., "Organic Light-Emitting Diodes Based on Charge-Neutral $Ru^{II}$ PHosphorescent Emitters," *Adv. Mater.*, 17(8):1059-1064 (2005).

(56) References Cited

OTHER PUBLICATIONS

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).
Wong, Wai-Yeung, "Multifunctional Iridium Complexes Based on Carbazole Modules as Highly Efficient Electrophosphors," *Angew. Chem. Int. Ed.*, 45:7800-7803 (2006).
Tang, C.W. and VanSlyke, S.A., "Organic Electroluminescent Diodes," *Appl. Phys. Lett.*, 51(12):913-915 (1987).
Adachi, Chihaya et al., "Organic Electroluminescent Device Having a Hole Conductor as an Emitting Layer," *Appl. Phys. Lett.*, 55(15):1489-1491 (1989).
Ma, Yuguang et al., "Triplet Luminescent Dinuclear-Gold(I) Complex-Based Light-Emitting Diodes with Low Turn-On voltage," *Appl. Phys. Lett.*, 74(10):1361-1363 (1999).
Gao, Zhiqiang et al., "Bright-Blue Electroluminescence From a Silyl-Substituted ter-(phenylene-vinylene) derivative," *Appl. Phys. Lett.*, 74(6):865-867 (1999).
Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Hung, L.S. et al., "Anode Modification in Organic Light-Emitting Diodes by Low-Frequency Plasma Polymerization of $CHF_3$," *Appl. Phys. Lett.*, 78(5):673-675 (2001).
Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).
Wang, Y. et al., "Highly Efficient Electraluminescent Materials Based on Fluorinated Organometallic Iridium Compounds," *Appl. Phys. Lett.*, 79(4):449-451 (2001).
Kwong, Raymond C. et al., "High Operational Stability of Electrophosphorescent Devices," *Appl. Phys. Lett.*, 81(1):162-164 (2002).
Holmes, R.J. et al., "Blue Organic Electrophosphorescence Using Exothermic Host-Guest Energy Transfer," *Appl. Phys. Lett.*, 82(15):2422-2424 (2003).
Sotoyama, Wataru et al., "Efficient Organic LIght-Emitting Diodes with Phosphorescent Platinum Complexes Containing NΛCΛN-Coordinating Tridentate Ligand," *Appl. Phys. Lett.*, 86:153505-1-153505-3 (2005).
Okumoto, Kenji et al., "Green Fluorescent Organic Light-Emitting Device with External Quantum Efficiency of Nearly 10%," *Appl. Phys. Lett.*, 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).
Aonuma, Masaki et al., "Material Design of Hole Transport Materials Capable of Thick-Film Formation in Organic Light Emitting Diodes," *Appl. Phys. Lett.*, 90:183503-1-183503-3 (2007).
Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).
Adachi, Chihaya et al., "High-Efficiency Red Electrophosphorescence Devices," *Appl. Phys. Lett.*, 78(11):1622-1624 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Hamada, Yuji et al., "High Luminance in Organic Electroluminescent Devices with Bis(10- hydroxybenzo[h]quinolinato)beryllium as an Emitter," *Chem. Lett.*, 905-906 (1993).
Nishida, Jun-ichl et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).
Mi, Bao-Xiu et al., "Thermally Stable Hole-Transporting Material for Organic Light-Emitting Diode: an Isoindole Derivative," *Chem. Mater.*, 15(16):3148-3151 (2003).

Huang, Wei-Sheng et al., "Highly Phosphorescent Bis-Cydometalated Iridium Complexes Containing Benzoimidazole-Based Ligands," *Chem. Mater.*, 16(12):2480-2488 (2004).
Niu, Yu-Hua et al., "Highly Efficient Electrophosphorescent Devices with Saturated Red Emission from a Neutral Osmium Complex," *Chem. Mater.*, 17(13):3532-3536 (2005).
Lo, Shih-Chun et al., "Blue Phosphorescence from Iridium(III) Complexes at Room Temperature," *Chem. Mater.*, 18(21):5119-5129 (2006).
Takizawa, Shin-ya et al., "Phosphorescent Iridium Complexes Based on 2-Phenylimidazo[1,2- α]pyridine Ligands: Tuning of Emission Color toward the Blue Region and Application to Polymer Light-Emitting Devices," *Inorg. Chem.*, 46(10):4308-4319 (2007).
Lamansky, Sergey et al., "Synthesis and Characterization of Phosphorescent Cydometalated Iridium Complexes," *Inorg. Chem.*, 40(7):1704-1711 (2001).
Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).
Noda, Tetsuya and Shirota,Yasuhiko, "5,5'-Bis(dimesitylboryl)-2,2'-bithiophene and 5,5"-Bis(dimesitylboryl)-2,2':5',2"-terthiophene as a Novel Family of Electron-Transporting Amorphous Molecular Materials," *J. Am. Chem. Soc.*, 120 (37):9714-9715 (1998).
Sakamoto, Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on π-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electra-Optical Characteristics Related to Structure," *Synthetic Metals*, 87:171-177 (1997).
Hu, Nan-Xing et al., "Novel High $T_g$ Hole-Transport Molecules Based on Indolo[3,2- b]carbazoles for Organic Light-Emitling Devices," *Synthetic Metals*, 111-112:421-424 (2000).
Salbeck, J. et al., "Low Molecular Organic Glasses for Blue Electroluminescence," *Synthetic Metals*, 91:209-215 (1997).
Baldo et al., "Highly Efficient Phosphorescent Emission from Organic Electroluminescent Devices," *Nature*, vol. 395, 151-154, (1998).
Baldo et al., "Very high-efficiency green organic light-emitting devices based on electrophosphorescence," Appl. Phys. Lett., vol. 75, No. 3, 4-6 (1999).
ORBEOS for OLED Lighting, Lead (Pb) Free Product—RoHS Compliant, Opto Semiconductors, Nov. 18, 2009.
Levermore et al., "Phosphorescent OLEDs: Lighting the way for energy-efficient solid-state light sources" Frontline technology, Information Display Oct. 2010, SID 2010.
U.S. Appl. No. 61/391,862, filed Oct. 11, 2010.

\* cited by examiner

METHOD OF FORMING BUS LINE DESIGNS FOR LARGE-AREA OLED LIGHTING

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to systems, and processes for fabricating OLED lighting panels, and particularly for designing and forming metal bus lines as may be used in large-area OLED lighting panels.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)$_3$, which has the following structure:

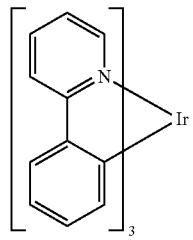

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

As used herein, a small area pixel is "equivalent" to a large area panel if (1) the organic stack of the small area pixel consists essentially of the organic layers of the organic stack of the large area panel; (2) the organic stack of the small area pixel is structurally equivalent to the organic stack of the large area panel; and/or (3) the organic stack of the small area pixel is functionally equivalent to the organic stack of the large area panel.

As used herein, the organic stack of a small area pixel "consists essentially of" the organic layers of the organic stack of a large area panel if the organic stack of the small area pixel is expected to have a similar JVL characteristic (where "J" is current density and "V" is voltage and "L" is luminance) as the organic stack of the large area panel. That is, the organic stack of the small area pixel will perform in the same way as the organic stack in the large area pixel. By using this terminology, it is intended to encompass a situation where devices are not exactly identical, but the differences comprise, for instance, only a slight change to the thickness of a layer; a slight modification to a concentration of one of the layers; a material substitution with a material known to behave in the same way, and/or other small modifications such that a person of ordinary skill in the art would understand that the devices would function the same way for purposes of lifetime testing. These situations, and other differences that do not materially affect the characteristics and function of the device, are intended to be covered by this language.

As used herein, a first organic stack is "structurally equivalent" to a second organic stack if the first organic stack comprises materials that are the same as the second organic stack, and the thickness and concentrations levels of these materials (while not necessarily precisely identical) are within experimental error. For instance, the thickness and concentrations of each of the layers of the first organic stack may be within 5% of the corresponding layers in the second organic stack.

As used herein, a first organic stack is "functionally equivalent" to a second organic stack if the first organic stack comprises the same layers as the second organic stack, with only variations that do not significantly affect the JVL characteristics of the organic stack. The variations may be in any form, by way of example, differences in thickness, concentrations, and/or material. If one of skill in the art believes that lifetime data from one device can reasonably be used to predict the lifetime of another device that is expected to have a similar lifetime, the devices are "functionally equivalent."

More details on OLEDs, and the definitions described above, can be found in U.S. Pat. No. 7,279,704, which is incorporated herein by reference in its entirety.

In large area OLED light panels, potential drops due to significant electrode resistances can cause luminance non-uniformity and reduce device efficacy. One method used to reduce potential drops is to introduce highly conductive bus lines. Bus lines are typically designed to deliver current from the electrode contacts and to distribute current evenly across the OLED light panel. Current distribution is then dependent on bus line resistance, electrode resistance, active area and the particular JVL characteristics of the OLED stack. Bus line resistance is determined by the resistivity of the bus line material and the geometry of the bus line, including thickness, length and width. In principle, the resistance of the bus lines could be reduced by using a material with lower resistivity (such as gold, silver, aluminum or copper) or increasing the height of the bus line. However, in practice, there is a finite height at which it is practical to deposit a bus line—any higher than, and it becomes difficult to dispose uniform thin films over the bus lines. Further reduction in the resistance is then typically achieved by increasing the width of the bus lines.

One drawback of using bus lines in OLEDs is that there is usually no light emission from the organic materials disposed over the bus lines. This means that the greater the area of the bus lines, the smaller the area that is available for light emission. When characterizing large area OLED light panels, a critical parameter is luminous emittance in units of $lm/m^2$, which expresses total light output delivered per unit area from the panel. For an approximately Lambertian emitter, luminous emittance $(lm/m^2) = \pi \times$ luminance $(cd/m^2) \times$ Fill Factor, where Fill Factor is the percentage of the OLED light panel area for which recombination and light emission is enabled. The lower the total area of the bus lines, the greater the Fill Factor and the lower the luminance that is then needed to deliver the same luminous emittance. This requirement for lower luminance, leads to improved lifetime and efficacy for OLED light panels with higher Fill Factor.

SUMMARY OF THE INVENTION

In view of the foregoing, it has been recognized that it is important not to pattern bus lines with an excessively large area. According to aspects of the invention, systems, and methods for the design and fabrication of OLEDs, including large-area OLEDs with metal bus lines, are provided. In embodiments various bus line design rules for large area OLED light panels may include mathematical models developed to optimize bus line design and/or layout on large area OLED light panels. In embodiments, for a given panel area dimension, target luminous emittance, OLED device structure and efficiency (as given by the JVL characteristics of an equivalent small area pixel), and electrical resistivity and thickness of the bus line material and electrode onto which the bus lines are disposed, a bus line pattern may be designed such that Fill Factor (FF), Luminance Uniformity (U) and Power Loss (PL) may be optimized. One general design objective may be to maximize FF, maximize U and minimize PL. Another approach may be, for example, to define minimum criteria for U and a maximum criteria for PL, and then to optimize the bus line layout to maximize FF. Note that for the equivalent small area pixel it is assumed that there is negligible potential drop in delivering charge to the OLED device. The equivalent pixel is required to have substantially the same organic layer device structure as in the OLED light panel.

As used herein, the inventors define luminous uniformity $U = L_{min}/L_{max}$, where luminance is measured at normal incidence directly over an active OLED area, and FF=(Panel Area−Bus Line Area)/Panel Area, where Panel Area is the area defined by the outline of the total plurality of Active Areas with surrounding Bus Line Areas. Bus Line Area includes surface area of bus lines and insulating coverage (optional). Panel Area is typically less than the Substrate Area, which includes encapsulation area and contact pads etc. Exemplary methods may include, for example, optimization of large area OLED light panel FF, U and PL using bus lines of fixed width, and optimization of large area OLED light panel FF, U and PL using bus lines of variable width.

According to first aspects of the invention, a method of manufacturing a light emitting panel, with a plurality of active areas, a plurality of bus lines and at least one pair of electrode contacts with the same polarity, may include determining equipotential lines on at least one electrode in the absence of bus lines. Embodiments may include determining an arrangement for a plurality of bus lines between the at least one pair of electrode contacts, the plurality of bus lines arranged to run substantially perpendicular to the determined equipotential lines.

Embodiments may include forming the plurality of bus lines in electrical contact with the electrode according to the determined arrangement.

In embodiments, the at least one pair of electrode contacts may include a pair of anode contacts, the electrode is anode, and the plurality of bus lines may be arranged between the pair of anode contacts.

In embodiments, the at least one pair of electrode contacts may include a pair of cathode contacts, the electrode is cathode, and the plurality of bus lines may be arranged between the pair of cathode contacts, such as in a top-emission OLED.

In embodiments, the equipotential lines may be determined for a first electrode and a second electrode; the at least one pair of electrode contacts may include a first set of electrode contacts for the first electrode and a second set of electrode contacts for the second electrode; a first set of the plurality of bus lines may be arranged between the first set of electrode contacts and a second set of the plurality of bus lines may be arranged between the second set of electrode contacts; and the first set of bus lines may be formed in electrical contact with the first electrode and the second set of bus lines may be formed in electrical contact with the second electrode. Such embodiments may include, for example, a substantially transparent OLED device.

In embodiments, the panel area may be substantially rectangular, with a first set of electrode contacts of the same electrical polarity on opposite sides of the electrode. The plurality of bus lines may be arranged in electrical contact with the electrode to closely run substantially perpendicular to the first set of electrode contacts.

In embodiments, the panel area may be substantially rectangular and include a first electrode and a second electrode, the second electrode separate, and opposite electrical polarity, from the first electrode. The equipotential lines may be determined for the first electrode and the second electrode. In embodiments, the at least one pair of electrode contacts may include a first set of electrode contacts, for the first electrode, and a second set of electrode contacts, for the second electrode. A first set of bus lines may be arranged between the first set of electrode contacts and a second set bus lines may be arranged between the second set of electrode contacts. The first set of bus lines may be formed in electrical contact with the first electrode and substantially perpendicular to the first set of electrode contacts, and the second set of bus lines may be formed in electrical contact with the second electrode and substantially perpendicular to the second set of electrode contacts. In embodiments, the first set of electrode contacts may be anode contacts. In embodiments, the first set of electrode contacts may be cathode contacts.

In embodiments, exemplary panel areas may be substantially rectangular and include electrode contacts of the same polarity on each side of the panel area. In such embodiments, the plurality of bus lines may be arranged such that a first set of the bus lines closely run substantially perpendicular to one pair of opposing sides of the panel area, and a second set of the bus lines closely run substantially perpendicular to the other pair of opposing sides of the panel area. The first set of the bus lines and the second set of the bus lines may be in electrical contact with the same electrode.

In embodiments, a first pair of opposing sides of the panel area may have a relatively long length compared to a second pair of opposing sides of the panel area. Electrode contacts of the same polarity may be included on at least the first pair of opposing sides of the panel area, and the plurality of bus lines may be arranged to closely run only substantially perpendicular to the first pair of opposing sides of the panel area.

In embodiments, the panel area may include a plurality of substantially rectangular active areas. In embodiments, first pairs of opposing sides of the active areas may have a relatively long length compared to second pairs of opposing sides of the active areas, and the active areas may be arranged such that the first pair of opposing sides of the active areas closely run substantially parallel to the plurality of bus lines.

In embodiments, the panel area may include a circular shape and the equipotential lines may be concentric. The bus lines may be arranged, for example, to run along radii extending from an edge of the circular shape to a center of the circular shape.

Embodiments may include calculating a minimum bus line width for the plurality of bus lines based on a given target working condition; and the plurality of bus lines may be formed according to the calculated minimum bus line width. The working condition could be a target luminous emittance and one or the combination of two of a minimum Uniformity, a minimum Fill Factor or a maximum Power Loss.

In embodiments, the calculating of the minimum bus line width may include providing horizontal dimensions of the panel area; providing resistivity values and thickness of the bus line material and the electrode onto which the bus line is disposed, providing JVL characteristics of an equivalent small area pixel, and optimizing values for at least one of a maximum Fill Factor, a maximum luminance Uniformity and a minimum Power Loss for the working condition.

In embodiments, a footprint of the outer dimensions of the at least one pair of electrode contacts may be equal to or larger than a perimeter footprint of the panel area.

According to further aspects of the invention, a method of manufacturing a light emitting panel with a plurality of active areas and a plurality of bus lines, may include providing horizontal dimensions of the panel area; providing device current density-voltage-luminance (JVL) data of an equivalent small area pixel; providing resistivity values and thickness of the bus line material and the electrode onto which the bus line is disposed; providing a target working condition for the light emitting panel; calculating at least one width of metal bus lines based on the horizontal dimensions of the panel area, device JVL data, resistivity and thickness of bus line material and the electrode onto which the bus line is disposed, and the target working condition; and/or forming the plurality of bus lines according to the at least one calculated value.

In embodiments, the panel area may comprise one or more active areas. The calculating of the at least one width of metal bus lines may include providing a length of at least one active area (S) and a height of this one active area (H). In embodiments, the calculating of the at least one width of metal bus lines may include calculating at least one of a width of metal bus lines along an x direction ($W_x$) and width of metal bus lines along a y direction ($W_y$), based on S, H, horizontal dimensions of the panel area, device JVL data, resistivity and thickness of bus line material and the electrode onto which the bus line is disposed, and the target working condition.

In embodiments, the panel area may be rectangular with length X and width Y, and FF may be solved according to the equation:

$$FF = \frac{X \cdot Y - \sum_{m=1}^{n} A_m}{X \cdot Y}$$

wherein, $A_m$ is the non-active surface area within the panel area caused by the presence of each bus line segment (this may include the bus line and the insulating material that covers the bus line).

In embodiments with a bus line running along a y direction, each segment of the bus line may have a resistivity ρ(y), thickness t(y), and width $W_x(y)$, and an angle θ(y) with respect to y, and the calculating of the at least one of $W_x$ and $W_y$ may include solving for a potential drop (ΔV) along the bus line of length L according to the equation:

$$\Delta V = \int_0^L \rho(y) \frac{|\vec{I}(y)|}{\cos^2\theta(y)|\vec{W}_x(y)|t(y)} |d\,y|$$

In embodiments, the calculating at least one width of metal bus lines may include solving for a Fill Factor (FF)>70% and a Luminance Uniformity (U)>80%. In embodiments, the light emitting panel may have a panel area, for example, >50 cm$^2$, and the calculating at least one width of metal bus lines may include solving for a FF>80% and a U>90%, or solving for a FF>90% and a U>90%.

In embodiments, the bus lines may be formed to run substantially perpendicular to the equipotential lines. Additionally, the panel area may operate at an average luminous emittance greater than 8,000 lm/m$^2$ inclusive of light extraction enhancement. This average luminous emittance may include the active area and the non-emissive bus lines between the active areas.

According to further aspects of the invention, a light emitting device may include a panel with a first electrode layer and an organic layer stack over the first electrode layer. A second electrode layer may be over the organic layer stack. At least one pair of first electrode contacts with the same electrical polarity may be provided in electrical contact with at least one of the first electrode layer and the second electrode layer. A plurality of bus lines may be included in electrical contact with the first electrode contacts and at least one of the first electrode layer and the second electrode layer. The bus lines may be disposed, for example, over the first electrode layer, under the first electrode layer, over the second electrode layer and/or under the second electrode layer. In embodiments, the panel area may have an area >50 cm$^2$, a Fill Factor (FF)>70% and a Luminance Uniformity (U)>80%.

In embodiments, the electrode contacts connected to the bus lines may be anode contacts, and the device may be a bottom-emitting OLED. In embodiments, the electrode contacts connected to the bus lines may be cathode contacts, and the device may be a top-emitting OLED. In embodiments, the electrode contacts may include a pair of anode contacts and a pair of cathode contacts, and a first set of bus lines may be arranged between the pair of anode contacts and a second set of the bus lines may be arranged between the pair of cathode contacts, and the device may be a transparent OLED.

In embodiments, the FF may be >80% and the U may be >90%, or the FF may be >90% and the U may be >90%.

In embodiments, the bus lines may be formed to run substantially perpendicular to equipotential lines.

In embodiments, the panel area may be configured to operate at an average luminous emittance greater than 8,000 μm/m$^2$ inclusive of light extraction enhancement.

In embodiments, a plurality of active areas may be arranged in the panel area, and at least one fuse may be connected to bus lines for each of the plurality of active areas.

In embodiments, the light emitting panel may include a Color Rendering Index (CRI) $R_a$>80 and a Duv<0.010.

In embodiments, electrode contacts may be disposed on all sides of the panel area. In embodiments, a footprint of the electrode contact may be equal to or larger than a perimeter footprint of the panel area.

According to further aspects of the invention, a light emitting device may include a first electrode layer, one or more first electrode contacts, an organic layer stack, a second electrode layer, one or more second electrode contacts, and a plurality of bus lines. In embodiments, the first electrode layer may have a same electrical polarity as the first electrode contacts, and/or the second electrode layer may have a same electrical polarity as the second electrode contacts. The plurality of bus lines may be in electrical contact with, for example, the first electrode layer and the first electrode contacts, and/or the second electrode layer and the second electrode contacts. In embodiments, at least one of the plurality of bus lines may include different resistances ($R_1$) along a length of the at least one bus line.

In embodiments, a cross sectional area of the at least one bus line may decrease along the length. In embodiments, at least one of a width and a height of the at least one bus line may monotonically decrease along the length.

In embodiments, the at least one bus line may include different materials with different conductivities.

In embodiments, $R_1$ may be lowest at an electrode contact end of the at least one bus line.

In embodiments, at least one of the electrode layers may include a first contact of the electrode and a second contact of the electrode opposite the first contact of the electrode. A first bus line may extend from the first contact of the electrode toward the second contact of the electrode and a second bus line may extend from the second contact of the electrode toward the first contact of the electrode. In embodiments, a width of the first bus line may decrease toward the second contact of the electrode, and a width of the second bus line may decrease toward the first contact of the electrode.

In embodiments, the bus lines may be tapered with a maximum width at an electrode contact end, and a minimum width at a distance greatest from the contact.

In embodiments, a luminance gradient dL/dx across the panel area may be approximately constant, e.g. $(dL/dx)_{min}/(dL/dx)_{max}$ greater than 0.5.

In embodiments, the voltage of the panel may be equal to or less than 0.2V greater than an equivalent small area pixel at the same current density.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION

Figure 1:
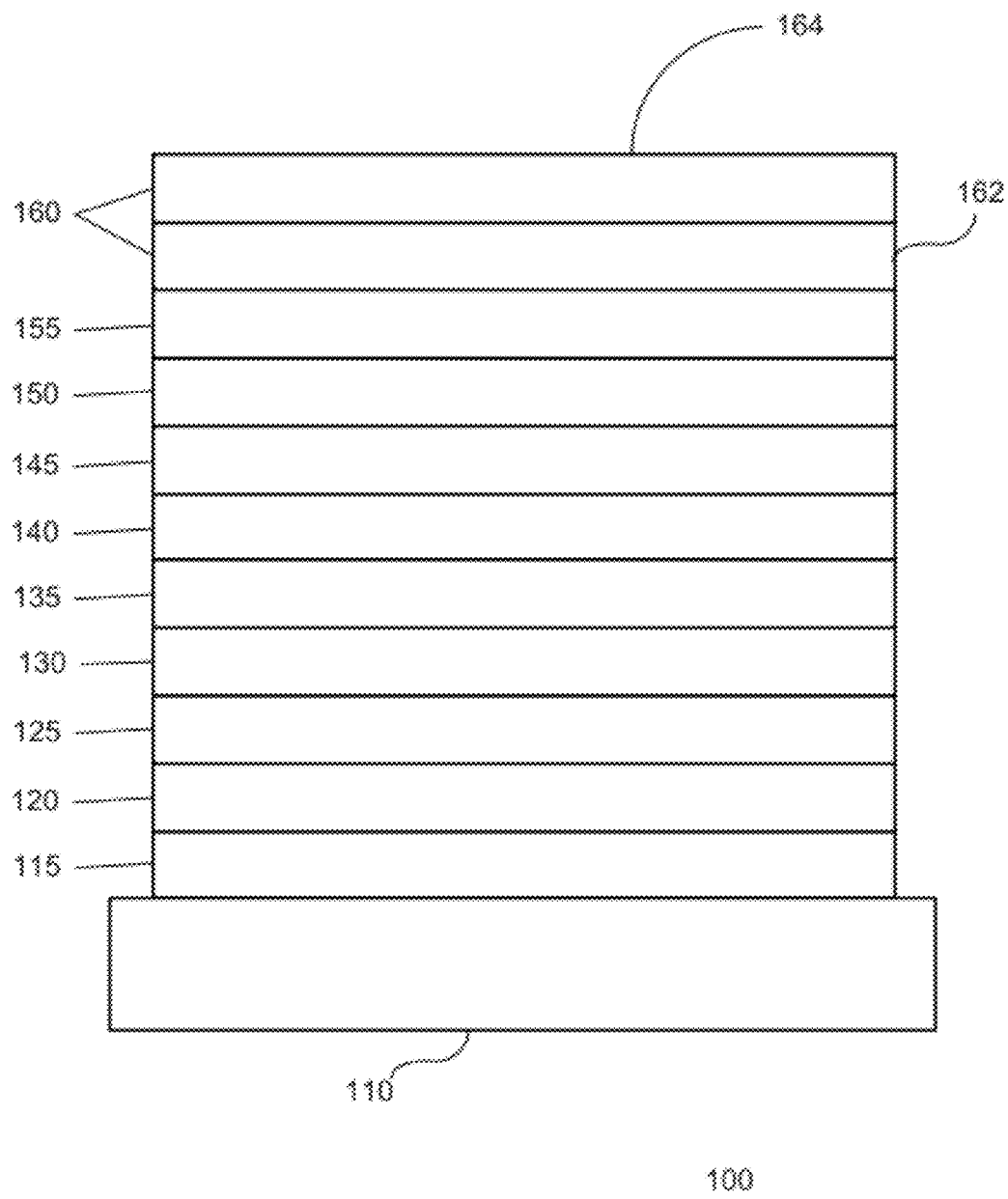
FIG. 1 shows an organic light emitting device.

It is understood that the invention is not limited to the particular methodology, protocols, and reagents, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a bus line" is a reference to one or more bus lines and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

The following preferred embodiments may be described in the context of exemplary OLED devices for ease of description and understanding. However, the invention is not limited to the specifically described devices and methods, and may be adapted to various circuit assemblies without departing from the overall scope of the invention. For example, devices and related methods including concepts described herein may be used for the assembly of microchips, optoelectronic devices, such as solar cells and photodetectors, and other apparatus with multi-layer circuitry.

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
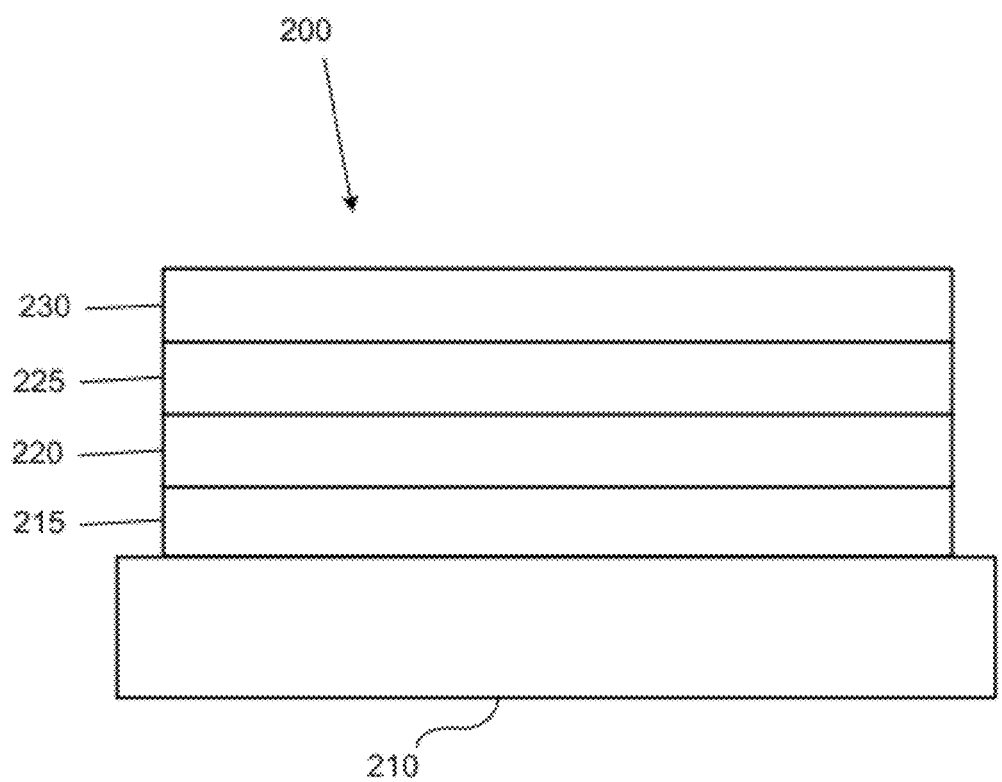
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As mentioned previously, bus lines may be used to reduce potential drops in large area OLED light panels, thereby reducing luminance non-uniformity and enhancing device efficacy. According to aspects of the invention, lighting panels including bus lines, and having both relatively high degree of Luminance Uniformity (U) and Fill Factor (FF), may be provided. In general, U and FF typically go against one another. However, through various techniques described herein, the inventors have modeled and produced devices achieving relatively high measures of U and FF together, particularly as compared to other known devices and techniques. For example, as described further herein, exemplary OLED devices designed in accordance with aspects of the present subject matter have been shown to include U of approximately 89% with FF of approximately 93%, which compares exceptionally well with other known devices.

Related aspects of the invention may also include specifically optimized bus line design techniques. Among other objects, the inventors have shown that overall potential drop may favorably be minimized, based on its relationship to U, and, since the current varies depending on the distance to the contact point, the resistance of the bus line may be varied accordingly to achieve an improved overall result, e.g. a bus line that is more conductive near the contact and less conductive farther away. This has been shown to be beneficial in, for example, minimizing bus line foot print (maximizing FF) for a desired uniformity, or maximizing uniformity for a fixed FF requirement. Various embodiments providing further details of the foregoing concepts are discussed further below, and may generally be referred to in terms of, for example, optimization of OLED light panel FF, U and PL using bus lines of fixed width, and optimization of large area OLED light panel FF, U and PL using bus lines of variable width.

For ease of description, exemplary embodiments based on anode bus lines may be discussed. Such configurations may find applicability, for example, with bottom-emission or transparent OLEDs. However, it should be appreciated that many of the same principles could be applied as well to cathode bus lines, such as may be used in top-emission or transparent OLEDs.

Luminous uniformity may be understood as $U=L_{min}/L_{max}$, where $L_{max}$ is the maximum luminance on the light panel and $L_{min}$ is the minimum luminance on the light panel. Luminance may be understood as measured at normal incidence to the device directly over an OLED active area. Non-Uniformity=1−U. Fill Factor may also be understood generally as FF=(Panel Area−Bus Line Area)/Panel Area, where Panel Area is the area defined by the outline of the total plurality of Active Areas with surrounding Bus Line Areas. Bus Line area includes surface area of bus lines and insulating coverage (optional). Panel Area is typically less than the Substrate Area, which includes encapsulation area and contact pads etc.

(A) Optimization of Large Area OLED Light Panel FF, U and PL Using Bus Lines of Fixed Width.

The inventors have found that, for a given panel dimension, target luminous emittance, OLED device structure and efficiency (as given by the JVL characteristics of an equivalent small area pixel), electrical resistivity and thickness of the bus line material and the electrode onto which the bus lines are disposed, a bus line pattern may be designed such that Fill Factor (FF), Luminance Uniformity (U) and Power Loss (PL) may be optimized. One general design objective may be to maximize FF, maximize U and minimize PL. Another approach may be, for example, to define minimum criteria for U and a maximum criteria for PL, and then to optimize the bus line layout to maximize FF. A given panel area dimension and target luminous emittance may be advantageously used to calculate the current flow in the panel. For example, for lower target luminous emittance, a lower current would be required, so bus lines with higher resistance that occupy less of the Panel Area may be used.

It has also been noted that luminance non-uniformity may arise because of potential drops on the bus lines and because of potential drops within individual electrode areas. Thus, the dimensions and the orientation of the individual electrode areas should also be decided upon certain criteria as well. For example the total panel area non-uniformity can be expressed as the product of non-uniformity arising from potential drops along the bus lines and non-uniformity arising from potential drops across the electrode areas.

Figure 3:
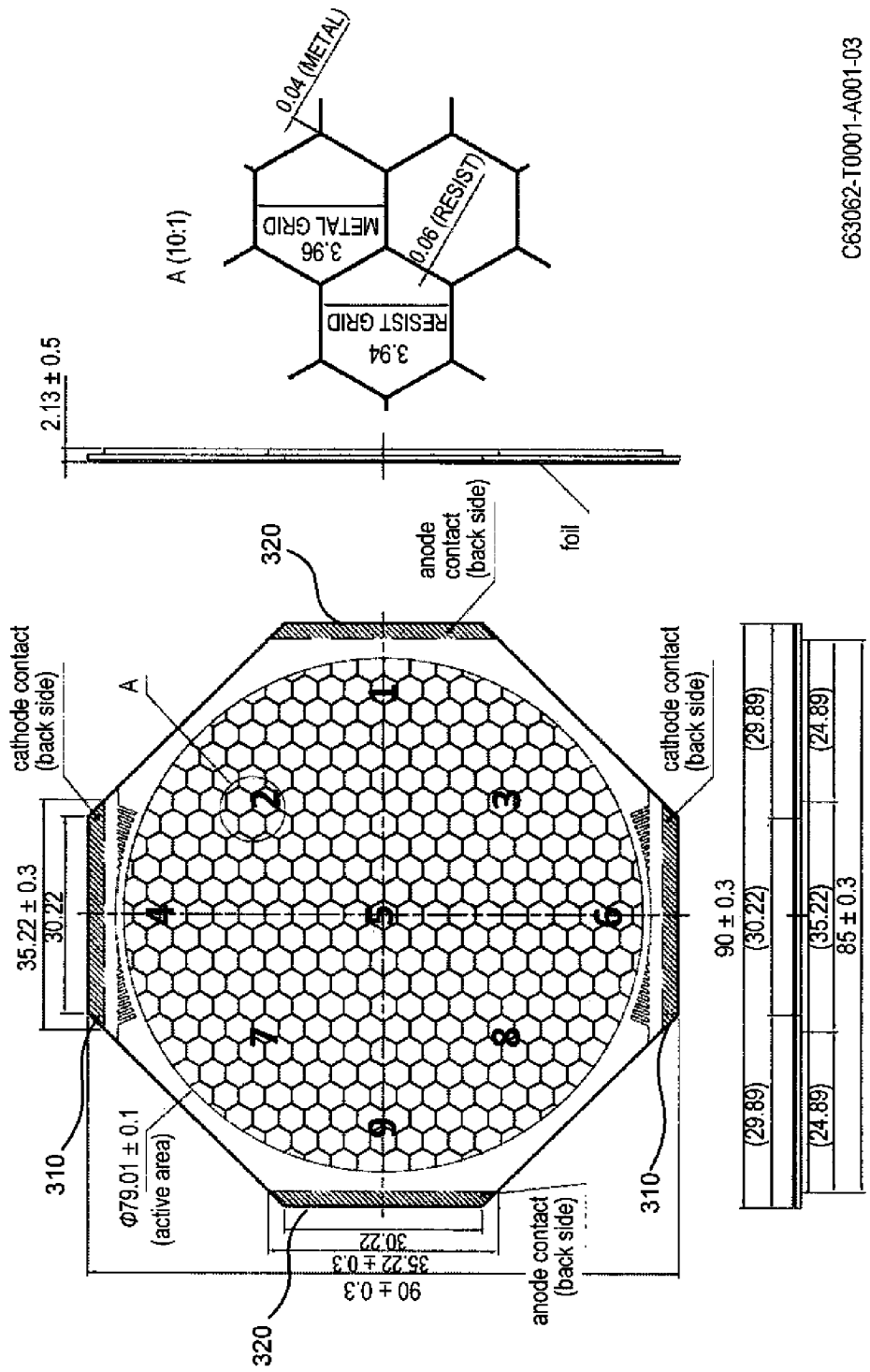
FIG. 3 shows an exemplary related-art device including bus lines.

As a starting point, it is instructive to study an example of the related art. FIG. 3 shows a schematic diagram of a related art commercially available OLED light panel, "REF 1." The total panel area is 49 cm$^2$, and the active area is approximately 48 cm$^2$. FF extracted from the diagram is about 98%. Nine points were marked on the panel, and luminance was measured at normal incidence to each point at V=4.2 V, I=0.607 A. Luminance values for each of the nine points are listed below in Table 1.

TABLE 1

| | 1 | 2 | 3 | 4 | 5 | 6 | 7 | 8 | 9 |
|---|---|---|---|---|---|---|---|---|---|
| Luminance (cd/m$^2$) | 2990 | 2750 | 2750 | 2870 | 2340 | 2650 | 2700 | 2610 | 2900 |

The particular driving conditions were chosen such that average luminous from the panel area as measured inside a 20" integrating sphere was approximately 9,000 μm/m$^2$ inclusive of approximately 1.5× light extraction enhancement The luminance values in Table 1 suggest slightly lower luminous emittance owing to the angular dependence of the emission. The uniformity $U=L_{min}/L_{max}$ calculated from the data is 78%. Luminance is lowest at the center of the light panel, and highest by the anode contacts.

As shown in FIG. 3, a double-contact configuration is used in this panel, where a pair of cathode contacts 310 are located at the top and bottom, and a pair of anode contacts 320 are on the right and left sides of the panel area. A double-contact configuration where the contacts include at least one pair of electrode contacts of the same polarity at the opposing sides of the panel area may, for example, enable better uniformity than for an equivalent panel with a single-contact configuration. This is because the average current path length from the contact is reduced in the double-contact configuration. This can lead to less IR loss in the device.

Nevertheless, the inventors have found that the contact design for the panel shown in FIG. 3 is not ideal. This can be appreciated from comparing FIGS. 4 and 5.

Figure 4:
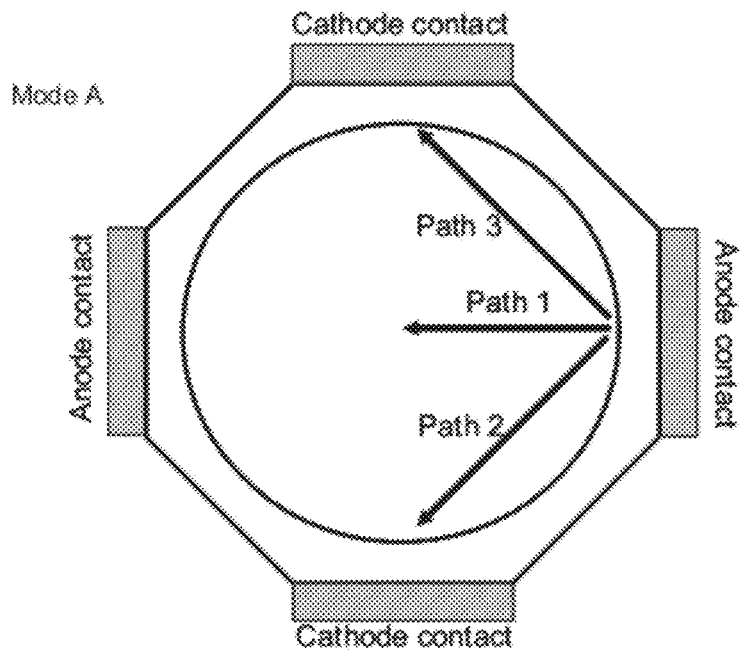
FIG. 4 shows a schematic diagram of an OLED configuration with anode and cathode contacts.

As illustrated in "Mode A" shown in FIG. 4, current will be delivered from the anode contact to the center through path 1.

For current to be conducted towards the top and bottom of the panel area, longer paths 2 and 3 are required. The longer paths cause more IR loss and thus greater luminance non-uniformity.

Figure 5:
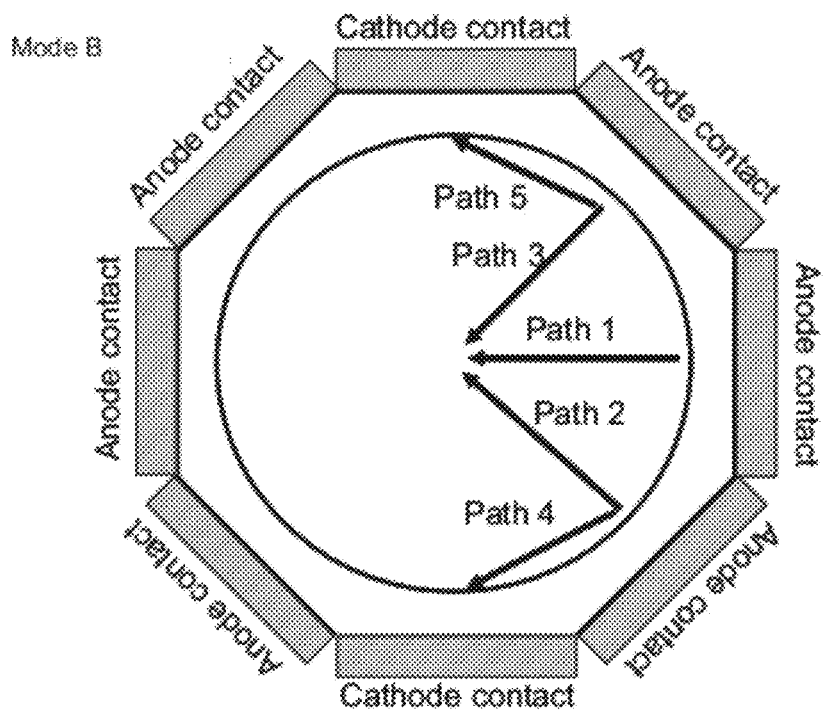
FIG. 5 shows a schematic diagram of an OLED configuration according to aspects of the invention.

On the contrary, "Mode B" shown in FIG. 5, includes additional anode contacts added along the edges of the device. In this configuration, current can be delivered through shorter paths 4 and 5 to the top and bottom sides of the panel area, and therefore better uniformity can be achieved. FIGS. 4 and 5 show one way in which the present subject matter may include the specific placement of, for example, the anode contacts, as well as optimizing the bus line design, may be used to minimize a required bus line length.

Additional luminance non-uniformity may also arise in certain known systems due to the active area extending beyond the lateral extent of the contact pads to which the bus lines are connected. This means that to illuminate the top and bottom edges of the light panel, current must travel not only perpendicular to the contacts, but also in a parallel direction to the contacts, which adds to the resistive loss and increases the demand on the bus lines.

As can be appreciated from the foregoing discussion, in order to achieve an optimized luminance uniformity, a minimum average current path length from electrode contacts to the active area may be designed into the panel. This means the electrode contacts should be equal to or larger than a perimeter footprint of the panel area. Also, double-contact, or multi-contact configuration may be desired in large-area panel design, for example, to reduce the lengths of the required bus lines.

In embodiments, equipotential lines may also be used to help determine an optimal arrangement for the bus lines. For example, equipotential lines on an electrode in the absence of bus lines, may be determined in relation to at least one electrode contact. An arrangement for a plurality of bus lines from the electrode contact may be determined, e.g. so that the plurality of bus lines run substantially perpendicular to the determined equipotential lines. It should be noted that mapping equipotential lines does not necessarily require one pair of electrodes, and that equipotential lines may be determined for a single electrode configuration as well.

Figure 6:
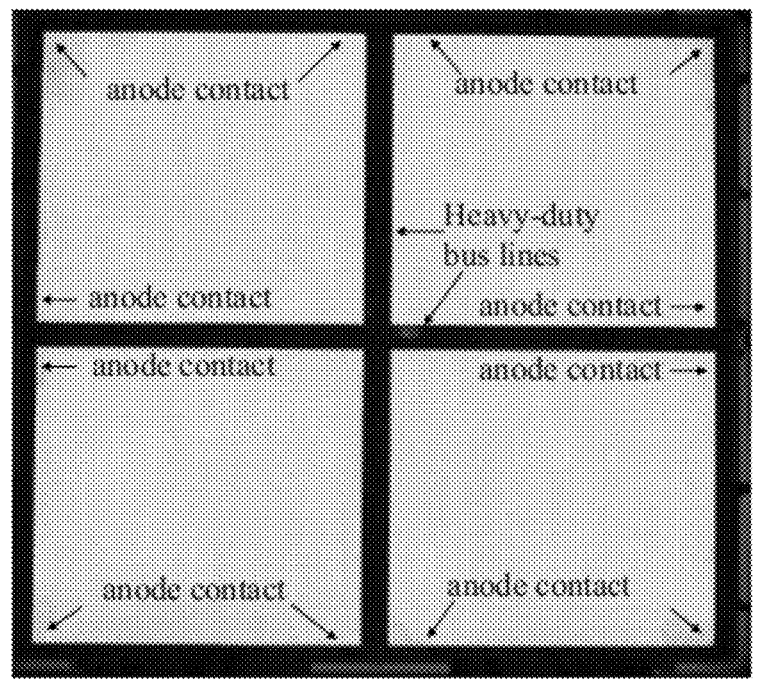
FIG. 6 shows a 4 section pattern of a 15 cm×15 cm OLED light panel according to aspects of the invention.
Figure 7:
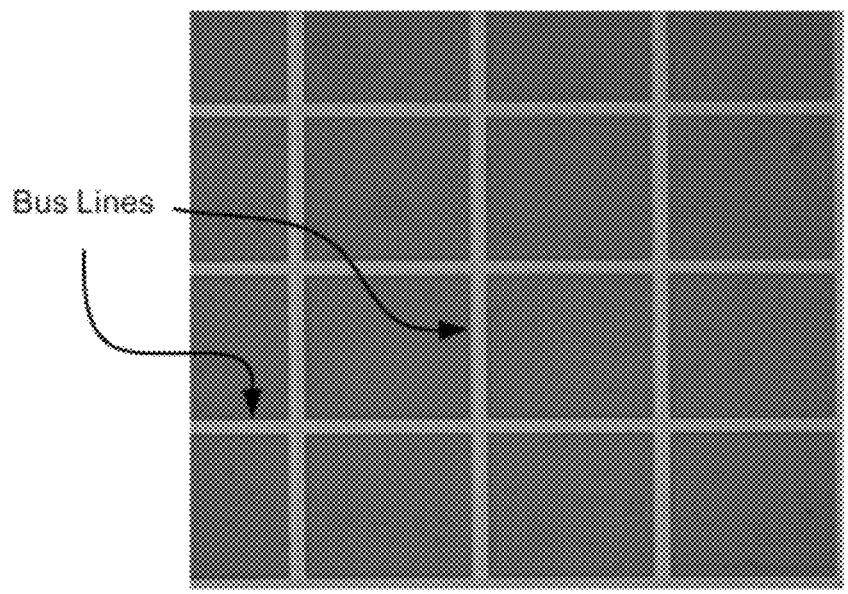
FIG. 7 shows a microscope picture of bus lines within each section.

An example of a 15 cm×15 cm OLED light panel, where the active area is divided into 4 electrically separated sections with each one surrounded by heavy duty (wide) bus lines is shown in FIG. 6. Within each section, there are also fine gold bus lines, shown in FIG. 7. This is the panel layout reported in UDC publication "Levermore et al. *Inf. Disp.*, Vol. 26, No. 10, 2010". For this OLED light panel, with total active area=125.44 cm$^2$ and panel area=176.9 cm$^2$, FF≈71%. For this panel operating at a luminance of 3,000 cd/m$^2$ (approximately 6,700 lm/m$^2$), a U≈75% was found, prior to any aging. For the same panel U=92% at 1,000 cd/m$^2$ (approximately 2,230 lm/m$^2$) after aging to LT70 (70% of the initial luminance). Considerable non-uniformity is observed at high luminance (even with relatively low FF) because of the non-optimized contact layout, where anode contacts are located on adjacent sides rather than opposing sides of the emissive sections. Secondly, FF is low due to the relatively large area occupied by the bus lines.

The inventors have developed mathematical models which may be used to describe design rules for bus line patterns to achieve optimized panel performance. The bus lines on a large area light panel may be disposed, for example, into a uniform pattern, such as a grid pattern, or a stripe pattern. The OLED light panel may then be divided into identical units, each unit composed of bus line part and OLED part.

Figure 8:
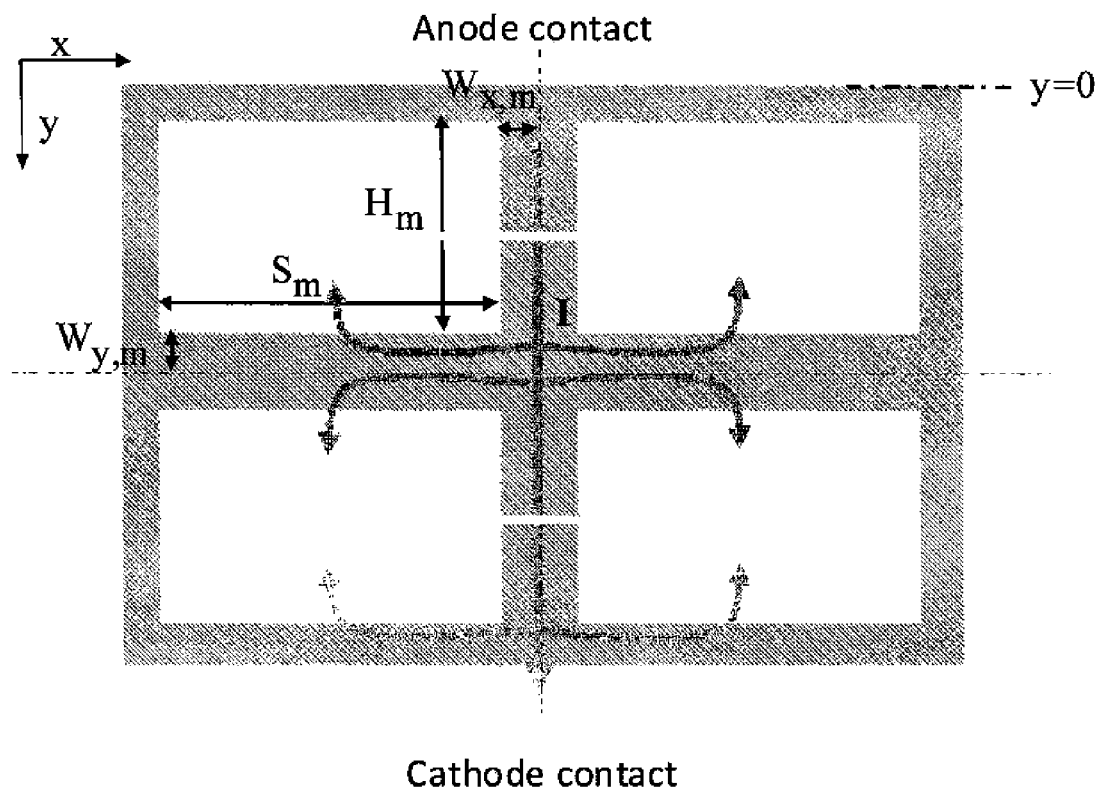
FIG. 8 shows four units, where each unit is surrounded by metal bus lines (shadow regions).

Initially, we consider a grid-pattern bus line layout for a large-area light panel. A four-unit diagram of a grid-pattern bus line is illustrated in FIG. 8, where each individual OLED device is surrounded by metal bus lines. The following parameters are defined: length of the active area (S), height of the active area (H) and the half width of the metal bus lines along both x and y direction ($W_x$ and $W_y$). In general, these parameters can vary from unit to unit. Also defined are the total length and width of the rectangular panel area; X (along x direction) and Y (along y direction). Assuming the anode contact starts at y=0, and that the end unit of each column has perfect contact with the electrode, then each column will be identical and the difference will be just between the rows. The n$^{th}$ unit is the one connected to the anode contact, the 1$^{st}$ unit is the farthest from the anode contact, and the m$^{th}$ unit is any arbitrary unit between the 1$^{st}$ and n$^{th}$ unit. Particularly, in a single-contact configuration, the 1$^{st}$ unit will be the unit connected to the cathode contact; in a double-contact configuration, where the anodes are on opposite edges of the panel area, it will be at or around the center of the column. For the m$^{th}$ unit in a column starting from the anode contact, the above parameters can be written as $H_m$, $S_m$, $W_{x,m}$, $W_{y,m}$. By varying the geometry values, both the resistances of bus lines and OLEDs can be tuned and thus current differences within the panel can be manipulated.

Figure 9A:
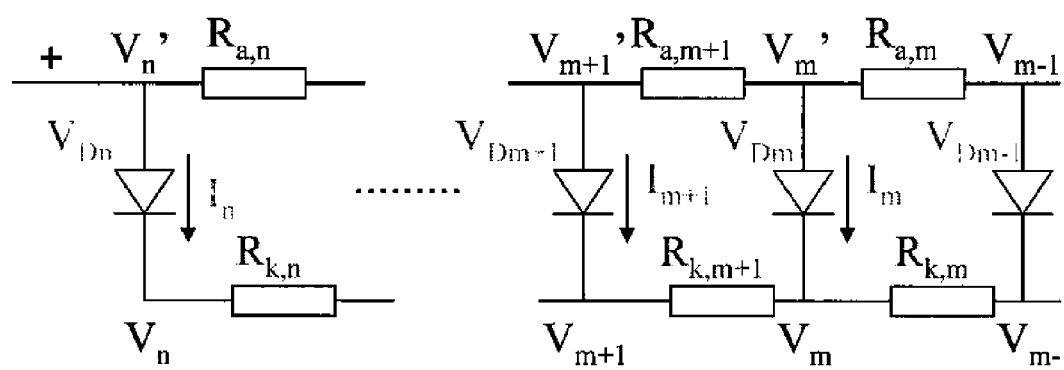
FIGS. 9A-9B show exemplary OLED circuits according to aspects of the invention.
Figure 9B:
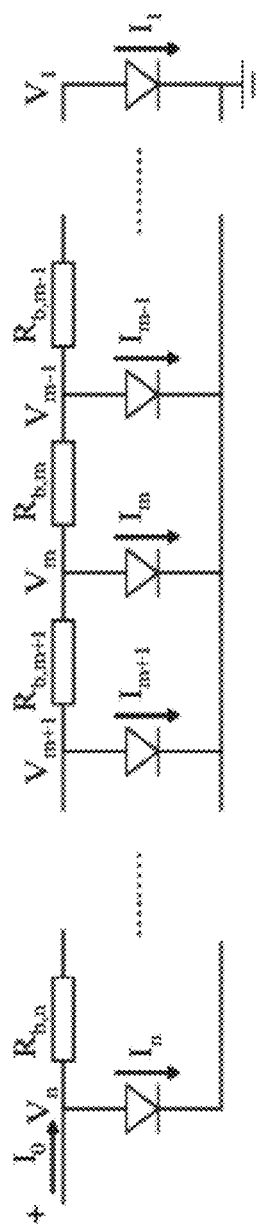

Since the metal bus lines are much more conductive than the TCO anode, it may be assumed that current will be majorly delivered to the OLEDs through the surrounding bus lines. Thus, an equivalent circuitry can be built for each row of units, as drawn in FIG. 9A, where $R_{b,m}$ is the metal bus line resistance of the m$^{th}$ unit, and $I_m$ is the current flowing through the m$^{th}$ OLED device. It may also be assumed the cathode is highly conductive, i.e. $R_k$=0, as shown in FIG. 9B. The equipotential lines are running substantially parallel to the contacts in this configuration. Note that each OLED may follow a basic circuitry as shown in FIG. 9B.

During panel level design, luminance uniformity (U) may be determined. The luminance (L) of each unit may be calculated from the current density (J) in each unit using L vs. J data for an equivalent small area pixel. Generally, the small area pixel need only be functionally or structurally equivalent to the panel, and does not need to be identical. In practice, L is approximately linearly dependent on J. The greatest difference in current density is expected between the unit closest to the anode contact ($J_n$) and the unit farthest from the anode contact ($J_1$). Therefore, U can be obtained from the ratio between $J_1$ and $J_n$, and hence $L_1$ and $L_n$. We then have U=$L_1$/$L_n$=$L_{min}$/$L_{max}$. Using similar means the inventors have calculated the power efficacy (PE) of the OLED light panel. The power loss PL is determined by the ratio of IR loss in the bus line over the total power of the panel, which can be acquired by calculation of current density in each unit. Fill factor (FF) can also be easily calculated from the parameters in FIG. 8. Therefore, by inputting those geometry variables, they were still able to have the output of panel uniformity, power efficacy (and hence power loss) and fill factor, and could choose the best combination of the results. The following explains further details of an exemplary bus line model.

According to the equivalent circuit drawn in FIG. 9B, we have:

$$\Delta V_m = V_{m+1} - V_m = R_{b,m} \cdot I_m \qquad \text{Eq. 1}$$

Eq. 1 describes the universal voltage drop between two adjacent units regardless of bus line layout. Where $R_{b,m}$ is the bus line resistance of m$^{th}$ segment, and $I_m$ is the current flowing through this segment. In general, if the bus line is running along y direction, and each segment has a resistivity ρ(y), thickness t(y), and width $W_x(y)$, and an angle $\theta(y)$ with respect to y, the total voltage drop for a bus line of length L can be further described as:

$$\Delta V = \int_0^L \rho(y) \frac{|\vec{I}(y)|}{\cos^2\theta(y)|\overline{W}_x(y)|t(y)} |dy|$$

For a particular grid-pattern bus line layout, where each pixel is in a rectangular shape, Eq. 1 can be further written as:

$$I_m = J_m \cdot A_m = J_m \cdot H_m \cdot S_m$$

$$V_{m+1} = V_m + R_{b,m} \cdot \sum_{i=1}^m I_i = V_m + R_{b,m} \cdot \sum_{i=1}^m J_i \cdot H_i \cdot S_i$$

For each OLED device, an exponential equation can be used to model the current as a function of voltage as below:

$$J = e^{1+bV+cV^2} \qquad \text{Eq. 2}$$

J is the current density flowing through the device, V is the driving voltage between anode and cathode, a, b and c are constants dependent on device structure and working conditions, and they can be extracted from a JVL curve of an equivalent small area pixel.

Similarly, the relationship between J and L from the JVL curve can be extracted as:

$$L = C_o + C_1 \cdot J + C_2 \cdot J^2 \qquad \text{Eq. 3}$$

where $C_o$, $C_1$ and $C_2$ are constants, decided by the device structure. This relation may be used to calculate power efficacy. Note that, depending on the JVL curve and accuracy requirements, the J-V and J-L functions can be varied.

Figure 10:
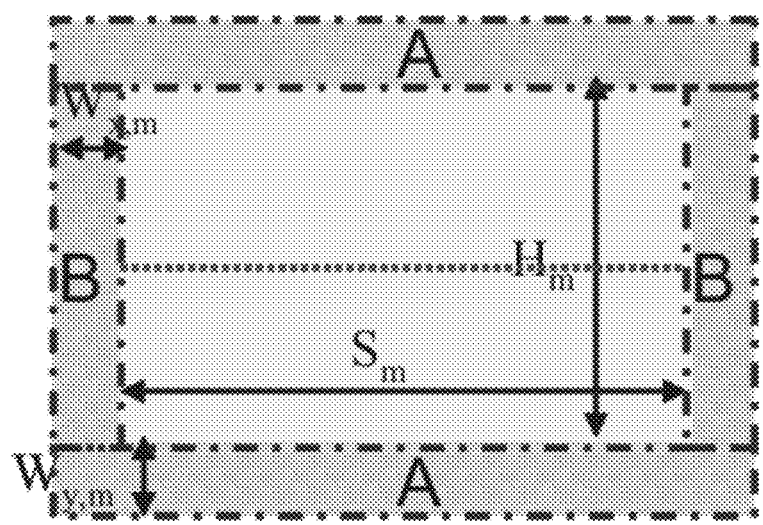
FIG. 10 shows various aspects of calculations for bus line resistances according to aspects of the invention.

To calculate the bus line resistance, the inventors have further divided the metal bus line frames into segments A and B (shown in FIG. 10), and the equivalent resistance is 2A+B/2, such that:

$$R_{b,m} = R_{sb} \cdot \left( \frac{2W_{y,m}}{S_m + 2W_{x,m}} + \frac{H_m}{2W_{y,m}} \right)$$

$R_{sb}$ is the sheet resistance of metal bus lines. This is determined by the resistivity $\rho_b$ and thickness $t_b$ of the metal as follows:

$$R_{sb} = \frac{\rho_b}{t_b}$$

If given initial values $V_1$, $J_1$, $W_{x1}$, $W_{y1}$, $S_1$ and $H_1$, $V_2$ can be calculated as:

$$I_1 = J_1 \cdot H_1 \cdot S_1$$

$$V_2 = V_1 + R_{b,1} I_1 = V_1 + I_1 R_{sb} \cdot \left( \frac{2W_{y,1}}{S_1 + 2W_{x,1}} + \frac{H_1}{2W_{y,1}} \right)$$

Then, using Eq. 2, $J_2$ can be acquired and hence $L_2$ calculated from Eq. 3. Next, $V_3$ can be calculated from $V_2$, $J_2$, $W_{x2}$, $W_{y2}$, $H_2$ and $S_2$. Therefore, by iterative calculation, current density and luminance of each unit can be acquired and uniformity $U = L_1/L_n = L_{min}/L_{max}$ as well.

Note that, in the typical operation range of interest, L can be considered linearly dependent on J. This is because in a well-designed panel with high uniformity there is very little variation in J or L, so luminous efficiency (cd/A) is approximately constant. Therefore, $U = L_{min}/L_{max} \approx J_{min}/J_{max}$. This simplifies the uniformity calculation procedure.

The model above describes a general case for grid-pattern, which means H, S, $W_x$ and $W_y$ can vary according to different m. One simplified situation is to have these variables independent of m:

$$H_m = H, S_m = S, W_{x,m} = W_x, W_{y,m} = W_y$$

that is to say, each unit will be identical across the entire panel. In this case, Eq. 1 can be rewritten as:

$$V_{m+1} = V_m + R_{b,m} I_m = V_m + HSR_{sb} \cdot \left( \frac{2W_y}{S + 2W_x} + \frac{H}{2W_y} \right) \cdot \sum_{i=1}^m J_i$$

In certain circumstances, a uniform grid pattern may be more acceptable in terms of visual appearance. One advantage of forming grid-pattern bus line is that fuses can be added to each pixel to prevent shorting without reducing Fill Factor. This is because, when integrating fuses, each pixel needs to be isolated from each other, which leaves non-emissive gaps on all four sides in between the adjacent pixels These gaps can be filled with bus lines to improve the current distribution while Fill Factor is not affected.

The power efficacy (PE) can be calculated as follows:

$$PE = \eta = \frac{\pi}{V_n} \frac{\sum_{m=1}^n L_m}{\sum_{m=1}^n I_m}$$

where $V_n$ is the voltage of the last OLED, i.e. the total input voltage, $$\sum_{m=1}^n I_m$$

and is the total input current.

The IR power loss (PL) caused by bus line resistance can be calculated as:

$$PL = \frac{\sum_{m=1}^n \left( \sum_{i=1}^m I_i \right)^2 \cdot R_{b,m}}{V_n \cdot \sum_{m=1}^n I_m}$$

This is expressed as a percentage of the power dissipated in the bus lines relative to the total input power.

As noted previously, FF may be understood as FF=(Panel Area−Bus Line Area)/Panel Area, where Panel Area is the area defined by the outline of the total plurality of Active Areas with surrounding Bus Line Areas. Bus Line Area includes surface area of bus lines and insulating coverage (optional). In general, Fill Factor of a rectangular panel area with panel length X and width Y can be defined as follows:

$$FF = \frac{X \cdot Y - \sum_{m=1}^{n} A_m}{X \cdot Y}$$

where $A_m$ is the non-active surface area within the panel area caused by the presence of each bus line segment (this may include the bus line and the insulating material that covers the bus line).

In order to prevent shorting, an insulating layer is normally disposed to cover the electrodes. The inventors define PI as the width of insulating material that covers the edge of each side of bus line. Since this extended region is not emissive, it reduces the active area. Taking this into consideration, FF in this particular case can be written as:

$$FF = \frac{(S - PI)(H - PI)}{(S + 2W_x)(H + 2W_y)}$$

An exemplary model has now been described, and parameters have been defined. The next step is to use the model to develop bus line design rules.

Figure 11:
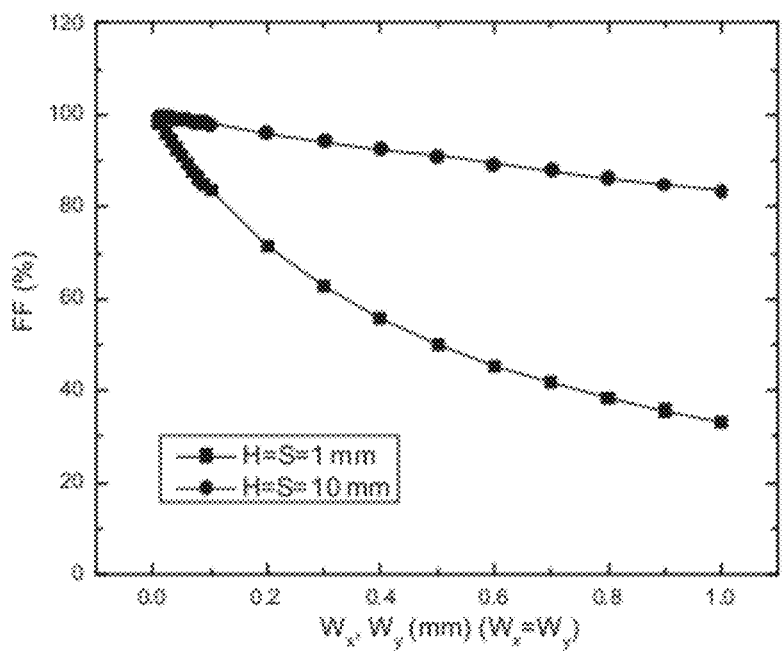
FIG. 11 shows Fill Factor plotted against $W_x$ and $W_y$ for a square OLED light panel with H=S=1 mm (squares) and H=S=10 mm (circles).

It is clear that the wider the bus lines are, i.e. the greater $W_x$ and $W_y$, the lower FF. On the other hand, FF is also strongly dependent on pixel size. Taking a square pattern as an example, where H=S, $W_x=W_y$, FIG. 11 plots FF as a function of $W_x$ ($W_y$), for H=S=1 mm (squares) and H=S=10 mm (circles). It is found that FF is less sensitive to the change of $W_x$ ($W_y$) when pixel size is relatively small. This implies that large size pixel may be desired in this case where wider bus lines can be disposed to improve U without losing too much FF.

Figure 12A:
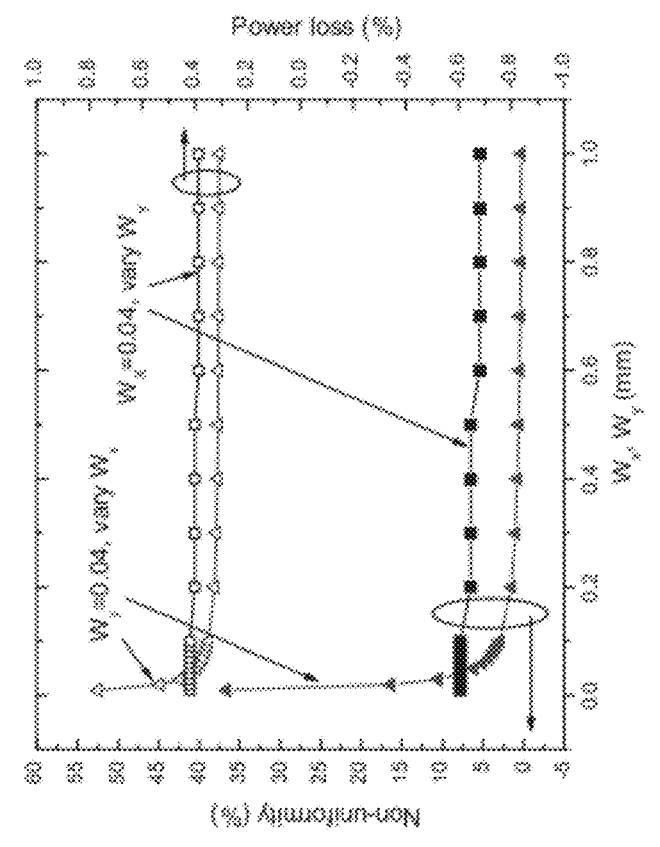
FIGS. 12A-12B show impact of $W_x$ and $W_y$ on panel non-uniformity and power loss for an active area unit size of 1 mm×1 mm and 10 mm×10 mm (with contacts only along y axis).
Figure 12B:
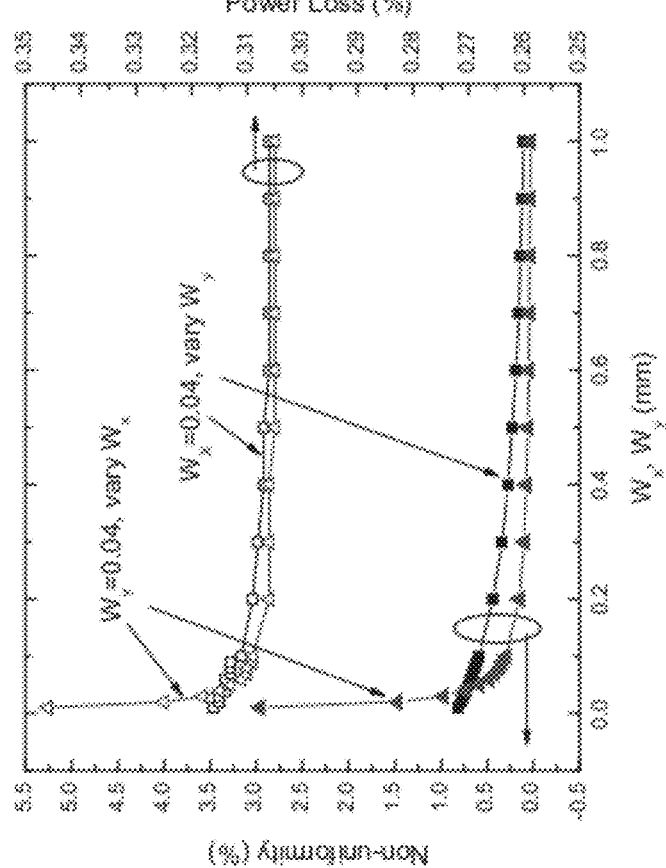

FIGS. 12A and 12B further compare non-uniformity (NU=1−U) and power loss (PL) as a function of $W_x$ with a fixed $W_y$ or vice versa, for active area unit size=1 mm×1 mm (FIG. 12A) and 10 mm×10 mm (FIG. 12B). Assuming the anode contact runs along the x-axis at y=0, it is found that the variation of $W_y$ (width of bus lines running along x parallel to the anode contact) have little impact on NU or PL, however, NU and PL decrease dramatically as $W_x$ (width of bus lines running along y perpendicular to anode contact) increases up to 200 microns. This clearly shows that bus lines running perpendicular to the anode contact into the active area play the critical role in determining NU and PL. Note that equipotential lines are running parallel to the contacts, and this implies bus lines running perpendicular to equipotential lines is more effective in enhancing uniformity.

Figure 13:
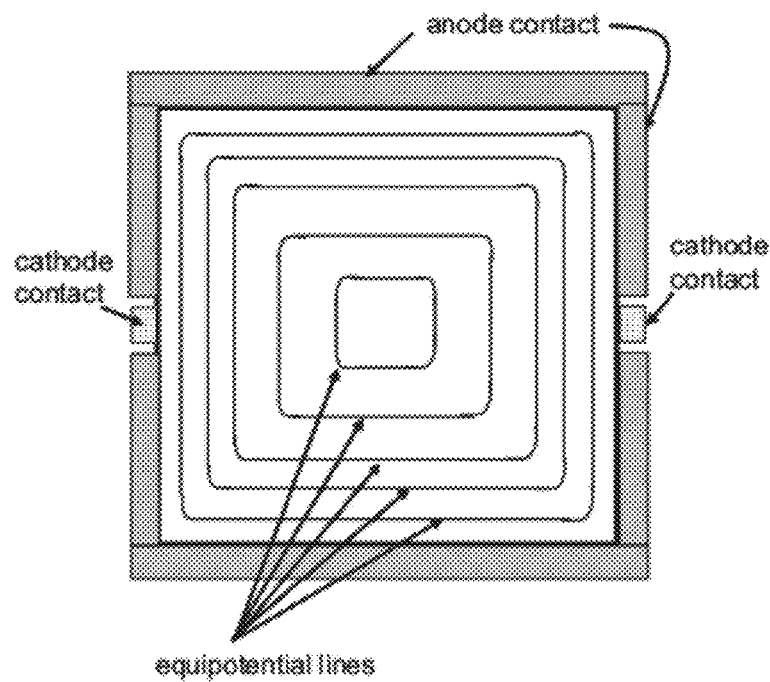
FIG. 13 shows a square OLED panel with anode contacts on four edges according to aspects of the invention.
Figure 14:
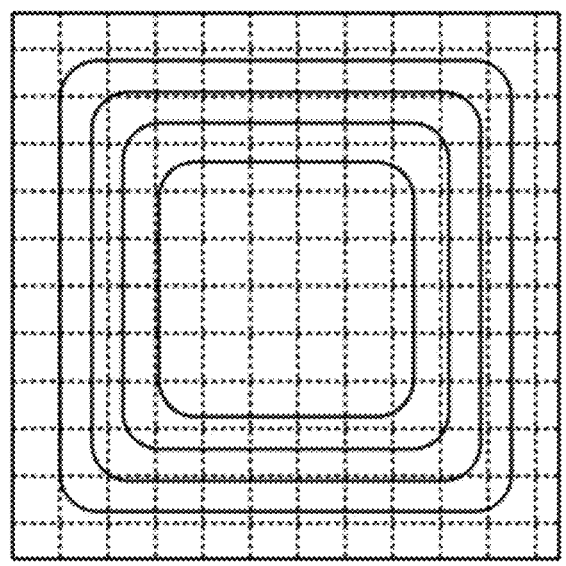
FIG. 14 depicts an OLED lighting panel with anode contacts on four edges and a grid-pattern bus line.

Bus lines running parallel to the equipotential lines have been found to do relatively little to reduce NU and PL. Therefore, in embodiments, bus lines should be placed perpendicular to equipotential lines to most effectively distribute currents. In this case, bus lines should be running perpendicular to the contacts. The equipotential lines are determined by the position of electrode contacts. For instance, in a square panel area where anode contacts are almost all around the four edges, equipotential lines are a group of rings, as shown in FIG. 13. In this case, bus lines may be designed as a grid pattern to run perpendicularly across the equipotential lines, as shown in FIG. 14.

Figure 15:
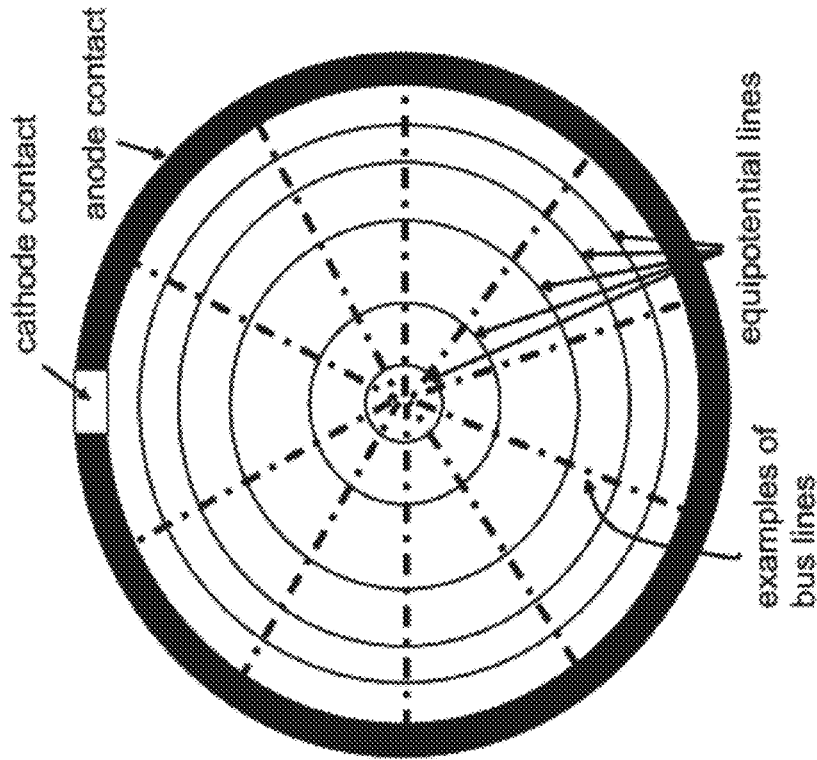
FIG. 15 depicts a circle-shape panel with anode contacts around the circumference.

Another example is shown in FIG. 15, where the panel area is circle-shape with anode contacts all around the circumference. The equipotential lines in this circumstance are concentric circles, and bus lines therefore should be designed along the radius from edge to the center. In addition, it should be noted that the size of active area unit also affects FF and PL, where the bigger the unit size, the more NU and PL arise.

Since the horizontal bus lines have been found to have little impact in terms of distributing current when the equipotential lines are horizontal as explained above, a stripe design, where $W_y=0$, may be used to help enhance the fill factor. For example, the inventors have chosen a phosphorescent small area device, which has the JV curve fitted according to the expression below:

$$J = e^{-19.02 + 7.44 \cdot V - 0.63 \cdot V^2}$$

This small area pixel operates at 3,000 cd/m$^2$ (inclusive of 1.5× light extraction enhancement) with V=4.33 V, and J=4.18 mA/cm$^2$. The bus line metal has a resistivity of 2.44× 10$^{-6}$ Ohm-m and thickness of 600 nm (equivalent sheet resistance of 0.004 Ohm/sq).

Figure 16:
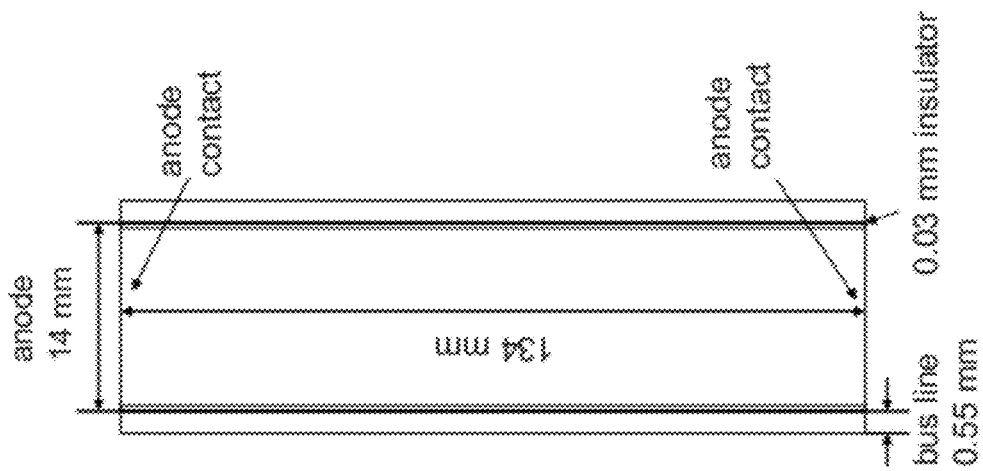
FIG. 16 shows a stripe design, with bus lines on two longer sides of the active area.

Using a target uniformity criteria of U>80%, the inventors have been able to find a FF=92.7%, when each stripe has anode width S=14 mm, half bus line width $W_x$=0.55 mm, an insulating material (as an example) extends PI=0.03 mm beyond the bus line edge, as illustrated in FIG. 16. The total length of anode, bus line and insulating material of each stripe is 134 mm, with anode contacts on top and bottom sides. Higher FF can be achieved by reducing PI width. Simulated uniformity (from one end of the stripe to the center) is about 84% and PL along the bus line is about 0.668%. As mentioned previously, total panel non-uniformity is the product of non-uniformity that arises from potential drops along bus lines and non-uniformity that arises from potential drops across active areas. The non-uniformity within each stripe was therefore investigated using a simulation process of one-dimensional bus line-free pixel performance. Resistivity $\rho_a$ and thickness $t_a$ of anode material (e.g. ITO) are required in this simulation. Uniformity of 96% with 0.367% power loss calculated within each stripe, where anode width S=14 mm, resistivity $\rho_a$=1.8× 10$^{-6}$ Ohm-m and thickness $t_a$=120 nm (equivalent sheet resistance of 15 Ohm/sq). Hence, the total expected uniformity is U=84%×96%≈81%, and the worst scenario for power loss in the bus lines and pixel area combined is PL=1−(1−0668%)× (1−0.367%)≈1%.

The inventors also note that, in practice, the central region of a large area light panel usually has slightly higher temperature than the outer edges. This higher temperature reduces the resistance of the OLED stack, which in turn compensates somewhat for the potential drop in the center of the panel. This leads to greater luminance in the center of the panel than predicted by the model, which in turn leads to improved U.

Based on a stripe design, the inventors fabricated a 15 cm×15 cm OLED lighting panel with 9 lighting stripes connected in parallel through gold bus lines using the same simulated device structure. There were anode contacts at the left and right sides of each stripe, and cathode contacts on the other two sides of the panel area. This double-contact configuration may be useful, for example, in improving luminance uniformity relative to an equivalent panel with just one contact of each polarity. The anode contacts were also designed to contact both ends of all 9 stripes such that there is negligible potential drop in delivering the charge to the start of each bus line. This electrode contact design helps to ensure that the minimum bus line width may be used, thereby enabling high FF. The active area of each stripe was 14.15 mm wide and 133.78 mm long, and the bus line was 1.1 mm wide. The FF of this panel was about 92.8%. Note that in order to maximize uniformity within the active area, it is preferred that where the active areas are rectangular with sides of different lengths, the bus lines run parallel to the side of greater length. Also note that where the panel area is rectangular with sides of different lengths, it is preferred that the bus lines run perpendicular to the side of greater length.

Figure 17:
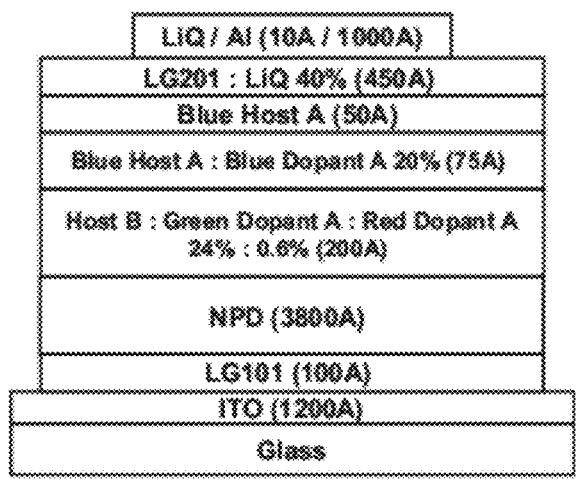
FIG. 17 shows an OLED stack.

Each OLED stripe has a device stack formed by vacuum thermal evaporation (VTE) deposition onto a soda lime glass substrate having an appropriate refractive index, e.g. n=1.5, as illustrated in FIG. 17. Each OLED includes, in order, an anode (1200 Å thick ITO), a hole injection layer (100 Å thick LG101, available from LG Chemicals of Korea), a hole transport layer (3800 Å thick NPD), a first emissive layer (200 Å thick Host B doped with 24% Green Dopant A and 0.6% Red Dopant A), a second emissive layer (75 Å thick Blue Host A doped with 20% Blue Dopant A), a blocking layer (50 Å thick Blue Host A), a layer (450 Å thick layer of LG201, available from LG Chemicals of Korea and 40% LiQ), and a cathode (10 Å thick layer of LiQ (lithium quinolate) and a 1000 Å thick layer of Al). Some examples of OLED materials that may be used to form the device stack are also discussed further below.

The light emitting panel has a color rendering index (CRI) $R_a$>80, and a Duv<0.010. In CIE 1931 (x, y) color space, the MacAdam ellipse size varies with color temperature, dependent on the photopic response of the human eye. In order to compare differences in color, it is therefore instructive to convert into CIE 1976 (u', v') color space, where coordinate differences are approximately proportional to perceived color differences. The conversion is very simple: u'=4x/(-2x+12y+3) and v'=9y/(-2x+12y+3). A measure known as Duv=$(\Delta u'^2 + \Delta v'^2)^{1/2}$ can then be used to quantify how far the chromaticity of a light source lies from the blackbody curve. As a general rule, when designing an OLED lighting panel, one should target a Duv<0.010, or more preferably Duv<0.006.

Figure 18:
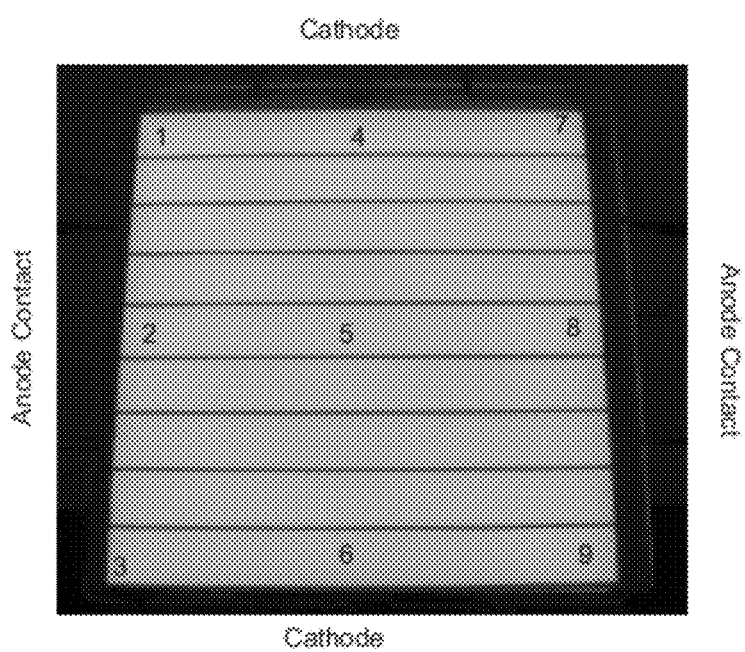
FIG. 18 is an image of an OLED lighting panel with stripes of pixels.

Luminance was measured at normal incidence at 5 mA/cm² current density at 9 points on the panel, as shown in FIG. 18. The particular driving conditions were chosen such that average luminous emittance from the panel as measured inside a 20" integrating sphere was approximately 8,700 μm/m² (inclusive of 1.5× light extraction enhancement). Table 2 lists luminance at each of the 9 points.

TABLE 2

Luminance of 9 points at J = 5 mA/cm² of the panel in FIG. 15.

| | 1 | 2 | 3 | 4 | 5 | 6 | 7 | 8 | 9 |
|---|---|---|---|---|---|---|---|---|---|
| Luminance (cd/m²) | 2720 | 2900 | 3010 | 2710 | 2850 | 2880 | 2730 | 2920 | 3050 |

Uniformity measured across the entire light panel U=$L_{min}/L_{max}$ is 89%. Note that in reality, the central region of the panel area normally has higher temperature than the edges due to the poorer heat dissipation, and this results in a larger current through the OLED. Therefore, the central region of the panel area is brighter than simulated result and this leads to a slightly higher uniformity number than predicted by the model. Within each stripe, luminance uniformity achieves 97% in average.

Table 3 summarizes the luminance and fill factor from references, simulation and measurement from an optimized panel. Based on the model, the inventors have optimized bus line design for a 15 cm×15 cm OLED light panel, and improved the uniformity by about 20% with an enhanced fill factor by 31%, compared to REF 2.

TABLE 3

Summary of references, simulation and measurement.

| | REF 1 | REF 2 | SIM 1 | DATA 1 |
|---|---|---|---|---|
| Size | 4" wafer | 15 cm × 15 cm | 15 cm × 15 cm | 15 cm × 15 cm |
| Uniformity | 78% | 75% | 81% | 89% |
| Fill Factor | 98% | 71% | 92.7% | 92.8% |

In view of the foregoing, several design objectives may be achieved, for example, an OLED light panel may be manufactured with a panel area>50 cm² and (1) FF>70% and U>80%; (2) FF>80 and U>90%; or (3) FF>90% and U>90%.

(B) Optimization of Large Area OLED Light Panel FF, U and PE Using Bus Lines of Variable Width.

In principle, luminance non-uniformity is caused by the voltage difference at each OLED sub-pixel. If we look into the general bus line Eq. 1 again $$\Delta V_m = R_{b,m} \cdot I_m \Rightarrow V_{m+1} = V_m + R_{b,m} \cdot \sum_{i=1}^{m} I_i$$

Figure 19:
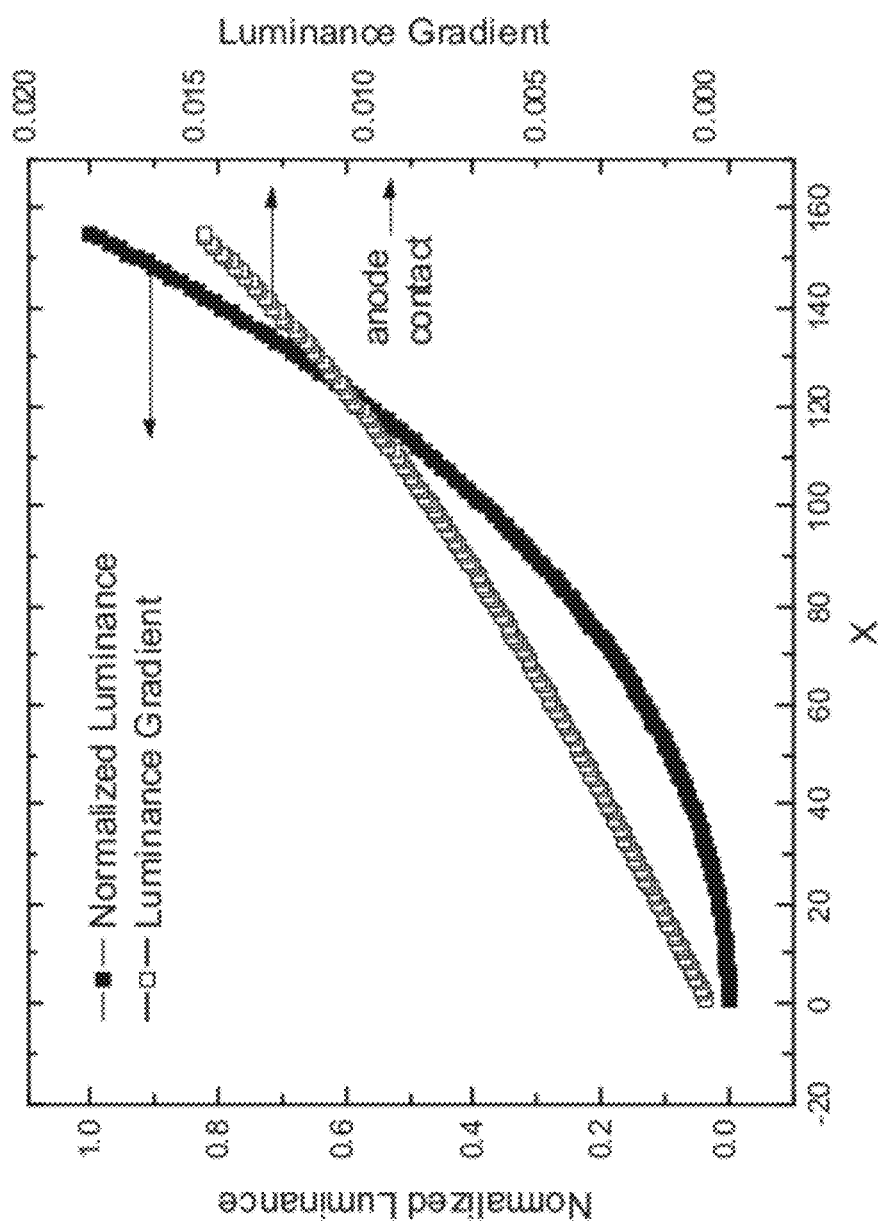
FIG. 19 is a normalized luminance and luminance gradient along bus line.

It can be seen that the voltage drop $\Delta V_m$ between neighboring units becomes greater as m increases (the greater the m is, the closer it is to the anode contact). This means that the voltage variation between adjacent units is more significant closer to the electrode contact, i.e. the current source. This is because when travelling away from the contact, the current will be dissipated along the bus lines, and hence become smaller and smaller as it flows farther. If the bus line is uniform (i.e. $R_{b,m}$ is a constant), then the voltage drop on the bus line I×R is linearly dependent on the current. Since the current is greatest near the contact region, the IR loss, i.e. the voltage drop, will be the greatest accordingly. As is known that luminance is determined by the voltage and the current, the large variation of voltage along bus lines causes the luminance non-uniformity. For instance, assuming a grid-pattern where each unit is identical, using the same device data and working condition as described in the previous section, normalized luminance can be plotted as a function of distance from the anode contact, X, in FIG. 19. Also plotted in FIG. 19 is the first derivative of the normalized luminance, reflecting the luminance gradient dL/dX. It can be seen that for a uniform-patterned bus line layout, the luminance gradient is greater near the contact than farther away. This means the luminance change along the bus lines is more dramatic near the contact regions due to the greater voltage drop. Take REF 1 panel as an example, the data in Table 1 shows that the luminance changes between spots 1 and 3 $\Delta L_{13}$ is 8.0%, while that between spots 3 and 6 $\Delta L_{36}$ is 3.6%, which gives $\Delta L_{36}/\Delta L_{13}$=0.45.

In order to reduce the dramatic luminance variation at the contact, lower IR loss is required near the electrode contacts. This can be achieved by enhancing the conductance of the bus lines, i.e. lower R, near electrodes contact regions. The conductance of bus lines can be tuned by, for example, using a more conductive metal, increasing the thickness, or the width. In practice, with a fixed bus line thickness and material type, a non-uniform layout is desired where the bus lines are wider at the anode contact end to ensure a lower resistance.

Generally, the luminance gradient along bus lines can be controlled by designing a non-uniform bus line pattern. In particular, a constant luminance gradient dL/dX=constant, or the ratio between minimum and maximum gradient (dL/

$dX)_{min}/(dL/dX)_{max}>0.5$, may be desired where the luminance change is not too dramatic for two neighboring units along the bus lines. Since the current becomes lower for OLED units farther away from the contact, bus line resistance therefore is allowed to be greater for the same IR drop. The bus lines can then be made narrower close to the farther end of the contact.

Figure 20:
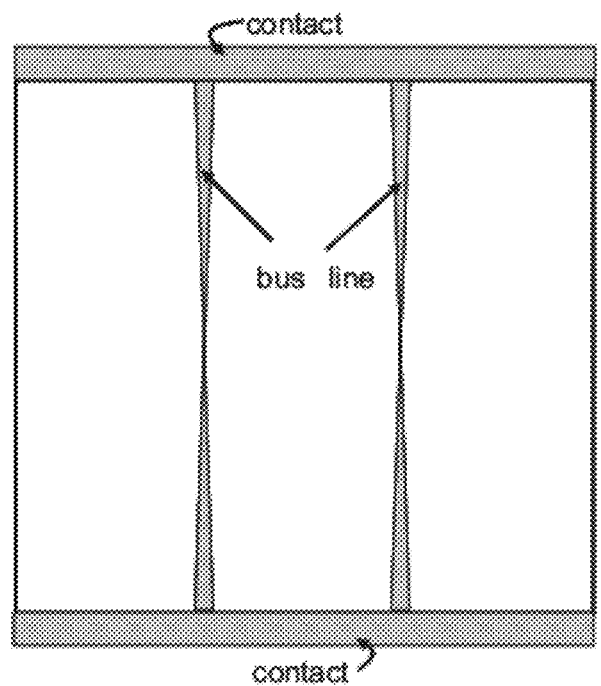
FIG. 20 depicts aspects of a non-uniform patterned bus line layout.

Another advantage of introducing non-uniform patterned bus lines is that with the same surface area of bus line metal at a fixed thickness, i.e. same FF, the luminance uniformity across the same length of OLED device is better than using a uniform bus line pattern. As a comparison with the uniform-stripe pattern, the bus lines can be designed to have a tapered shape with a double-contact configuration, as illustrated in FIG. 20. The model is accordingly modified to simulate this non-uniform case. Instead of having a constant bus line width $W_x$, an increment $\Delta$ is added to the bus line width of each unit:

$$W_{x,m+1} = W_{x,m} + \Delta$$

At the same time, the active area will shrink by $\Delta \cdot H$, due to the increase of bus line width. If given an initial $W_{x,o}$, the surface area of metal can be calculated. The combination of $W_{x,o}$ and $\Delta$ needs to be tuned to keep the surface area the same as that in the uniform-stripe design.

Figure 21:
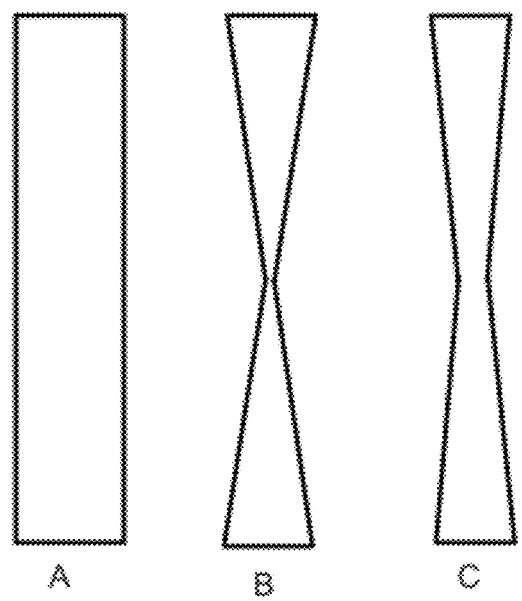
FIG. 21 is an illustration of bus lines A, B and C from Table 4.
Figure 22:
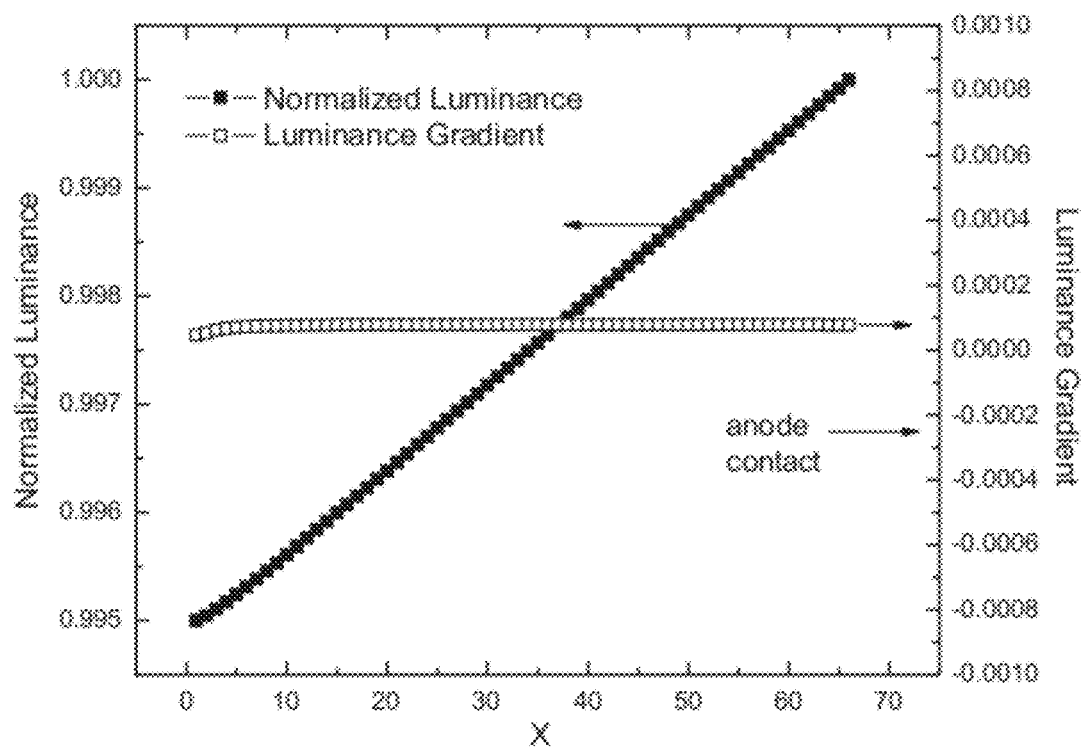
FIG. 22 is a chart showing normalized luminance and luminance gradient.

Using the same device data and working condition as described in the previous section, the inventors calculated U and PL at various combination of $W_{x,o}$ and $\Delta$, as a comparison to the uniform pattern, as listed in Table 4. As an example, bus lines A, B, and C are drawn in FIG. 21. It can be seen that bus lines with tapered shape have better luminance uniformity and less power loss than the uniform stripe shape. In particular, a preferred mode exists for the tapered bus line. In this example, the combination of $W_{x,o}=0.02$ mm and $\Delta=0.0161$ mm, has been found to enable the highest U=89.1%, and the least PL=0.495%. The normalized luminance and luminance gradient at this combination is plotted in FIG. 22. Compared to FIG. 19, the luminance has a more even variation along the bus line, and the gradient is almost constant. The tapered bus line therefore enables greater U compared to a uniform bus line layout.

TABLE 4

Comparison of U and PL at various combination of $W_{x,o}$ and $\Delta$, with the uniform pattern.

| Example | $\Delta$ [mm] | U | PL |
|---|---|---|---|
| | Uniform $W_x$ [mm] | | |
| A | 0.550 | 0.0000 | 84.0% | 0.668% |
| | Tapered $W_{xo}$ | | |
| B | 0.002 | 0.0166 | 89.0% | 0.497% |
| | 0.020 | 0.0161 | 89.1% | 0.495% |
| | 0.220 | 0.0100 | 88.4% | 0.527% |
| C | 0.400 | 0.0046 | 86.4% | 0.588% |

Alternatively, if keeping the same luminance uniformity performance, less metal is required in a non-uniform bus line pattern than a uniform one. By varying the bus line widths, not only the voltage drop can be balanced, but the Fill Factor can be enhanced as well.

Figure 23:
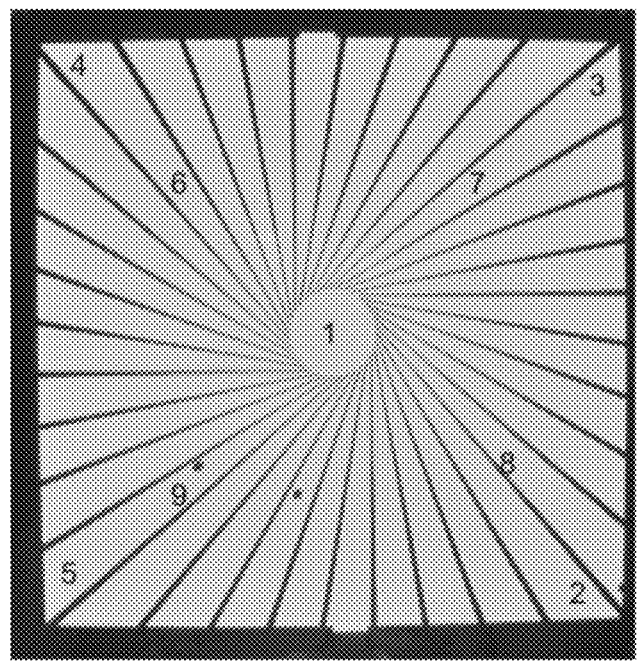
FIG. 23 depicts an example of non-uniform patterned bus line in a spiral shape, with luminance measured at the numbered spots.

An example of non-uniform-patterned bus line is shown in FIG. 23. In this example, a multi-contact configuration is applied where anode contacts are on all four sides of the panel. Metal bus lines are conducting current from surrounding contacts toward the center of the plate with a reduced widths forming a spiral shape. A device stack as illustrated in FIG. 17 was used to fabricate the OLED lighting panel on a 15 cm×15 cm soda lime glass substrate. The metal bus line is 4000 Å thick aluminum, the sheet resistance of which is about 0.05 ohm/square. The luminance of different points (numbered in FIG. 23) measured at 5 mA/cm² current density are listed in Table 5.

TABLE 5

Luminance of 9 spots at 5 mA/cm² current density of the panel in FIG. 19.

| | 1 | 2 | 3 | 4 | 5 | 6 | 7 | 8 | 9 |
|---|---|---|---|---|---|---|---|---|---|
| Luminance (cd/m²) | 1360 | 1410 | 1390 | 1410 | 1420 | 1390 | 1400 | 1380 | 1400 |

As can be extracted from the luminance data, the uniformity along the bus line of this spiral shaped panel is 96.5% in average. More importantly, the luminance variation along the bus lines follows a constant gradient, about 0.04%/mm in average.

In conclusion, to get the highest uniformity, the inventors have proposed and developed various methods to minimize the overall potential drop along the bus line of a length L, which takes consideration of all the parameters involved: panel area dimension, required luminous emittance, dimensions of the bus lines, resistivity and thickness of the bus line material and the electrode, variation and orientation of the bus line, JVL characteristic of an equivalent small area pixel etc, as shown in the following equation:

$$\Delta V = \int_0^L \rho(y) \frac{|\vec{I}(y)|}{\cos^2\theta(y)|\vec{W}_x(y)|t(y)} |dy|$$

where at position y, $\rho(y)$ is the resistivity of the bus line metal, I(y) is the current, $W_x(y)$ is the width of the bus line, t(y) is the thickness of the bus line and $\theta(y)$ is the angle between current flowing direction and y direction.

It should be noted that, in various embodiments such as those depicted in FIGS. 13, 14, 15, 18, 20 and 23, the electrode contacts may extend to or beyond the border of the active area(s). That is, a "footprint" set by the outermost dimensions of the electrode contacts may be equal to or greater than a footprint of the panel area outer border.

An organic light emitting device is also provided including features as described herein. The device may include an anode, a cathode, and an organic emissive layer disposed between the anode and the cathode. The organic emissive layer may include a host and a phosphorescent dopant, exemplary materials of which are discussed further below.

According to aspects of the present subject matter, the inventors have successfully fabricated, for example, a 15 cm×15 cm OLED light panel on an ITO anode with sheet resistance≈15 Ohm/sq. There were 9 individual active areas, each one a stripe measuring 13.378 cm×1.415 cm=18.930 cm², which gives total active area=170.369 cm². The individual active area in the example is almost 20 times greater than taught by other devices. The panel area for the layout in this work is 183.587 cm², which gives FF≈92.8% and Uniformity>95% within each individual active area, and U is also substantially higher than in previous work.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

HIL/HTL:

A hole injecting/transporting material to be used in the present invention is not particularly limited, and any compound may be used as long as the compound is typically used as a hole injecting/transporting material. Examples of the material include, but not limit to: a phthalocyanine or porphryin derivative; an aromatic amine derivative; an indolocarbazole derivative; a polymer containing fluorohydrocarbon; a polymer with conductivity dopants; a conducting polymer, such as PEDOT/PSS; a self-assembly monomer derived from compounds such as phosphonic acid and sliane derivatives; a metal oxide derivative, such as $MoO_x$; a p-type semiconducting organic compound, such as 1,4,5,8,9,12-Hexaazatriphenylenehexacarbonitrile; a metal complex, and a cross-linkable compounds.

Examples of aromatic amine derivatives used in HIL or HTL include, but not limit to the following general structures:

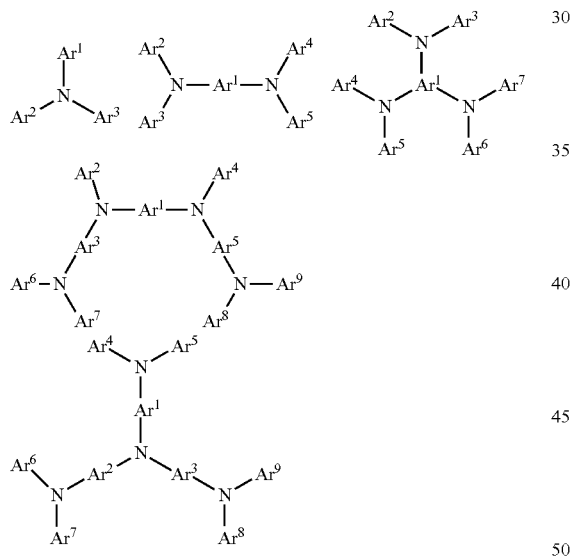

Each of $Ar^1$ to $Ar^9$ is selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group. Wherein each Ar is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, $Ar^1$ to $Ar^9$ is independently selected from the group consisting of:

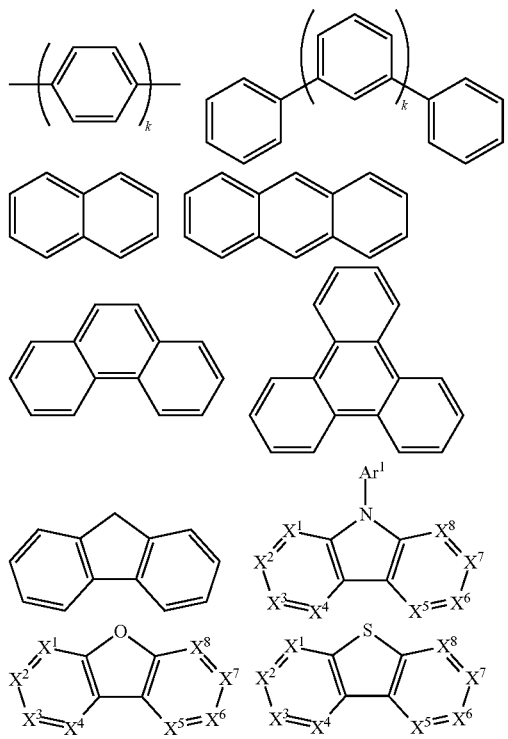

k is an integer from 1 to 20; $X^1$ to $X^8$ is CH or N; $Ar^1$ has the same group defined above.

Examples of metal complexes used in HIL or HTL include, but not limit to the following general formula:

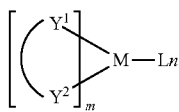

M is a metal, having an atomic weight greater than 40; $(Y^1-Y^2)$ is a bindentate ligand, Y1 and $Y^2$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, $(Y^1-Y^2)$ is a 2-phenylpyridine derivative.

In another aspect, $(Y^1-Y^2)$ is a carbene ligand.

In another aspect, M is selected from Ir, Pt, Os, and Zn.

In a further aspect, the metal complex has a smallest oxidation potential in solution vs. Fc+/Fc couple less than about 0.6 V.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant.

Examples of metal complexes used as host are preferred to have the following general formula:

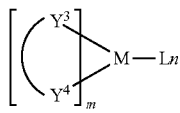

M is a metal; $(Y^3-Y^4)$ is a bindentate ligand, $Y^3$ and $Y^4$ are independently selected from C, N, O, P, and S; L is an ancillary ligand; m is an integer value from 1 to the maximum number of ligands that may be attached to the metal; and m+n is the maximum number of ligands that may be attached to the metal.

In one aspect, the metal complexes are:

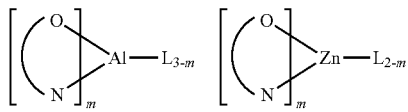

(O—N) is a bidentate ligand, having metal coordinated to atoms O and N.

In another aspect, M is selected from Ir and Pt.

In a further aspect, $(Y^3-Y^4)$ is a carbene ligand.

Examples of organic compounds used as host are selected from the group consisting aromatic hydrocarbon cyclic compounds such as benzene, biphenyl, triphenyl, triphenylene, naphthalene, anthracene, phenalene, phenanthrene, fluorene, pyrene, chrysene, perylene, azulene; group consisting aromatic heterocyclic compounds such as dibenzothiophene, dibenzofuran, dibenzoselenophene, furan, thiophene, benzofuran, benzothiophene, benzoselenophene, carbazole, indolocarbazole, pyridylindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, phenoxazine, benzofuropyridine, furodipyridine, benzothienopyridine, thienodipyridine, benzoselenophenopyridine, and selenophenodipyridine; and group consisting 2 to 10 cyclic structural units which are groups of the same type or different types selected from the aromatic hydrocarbon cyclic group and the aromatic heterocyclic group and are bonded to each other directly or via at least one of oxygen atom, nitrogen atom, sulfur atom, silicon atom, phosphorus atom, boron atom, chain structural unit and the aliphatic cyclic group.

Wherein each group is further substituted by a substituent selected from the group consisting of hydrogen, deuterium, halide, alkyl, cycloalkyl, heteroalkyl, arylalkyl, alkoxy, aryloxy, amino, silyl, alkenyl, cycloalkenyl, heteroalkenyl, alkynyl, aryl, heteroaryl, acyl, carbonyl, carboxylic acids, ester, nitrile, isonitrile, sulfanyl, sulfinyl, sulfonyl, phosphino, and combinations thereof.

In one aspect, host compound contains at least one of the following groups in the molecule:

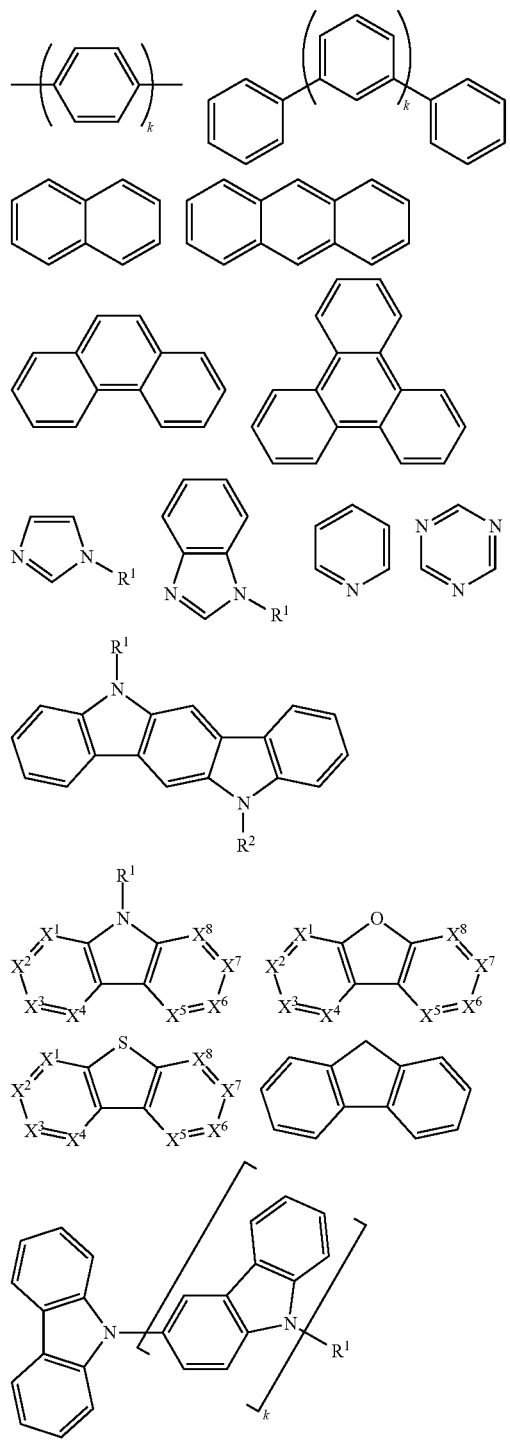

-continued

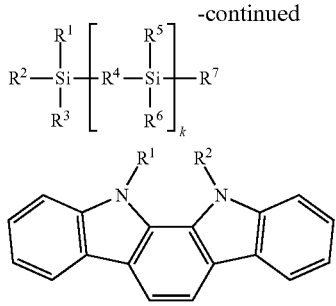

R$^1$ to R$^7$ is independently selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

k is an integer from 0 to 20.

X$^1$ to X$^8$ is selected from CH or N.

HBL:

A hole blocking layer (HBL) may be used to reduce the number of holes and/or excitons that leave the emissive layer. The presence of such a blocking layer in a device may result in substantially higher efficiencies as compared to a similar device lacking a blocking layer. Also, a blocking layer may be used to confine emission to a desired region of an OLED.

In one aspect, compound used in HBL contains the same molecule used as host described above.

In another aspect, compound used in HBL contains at least one of the following groups in the molecule:

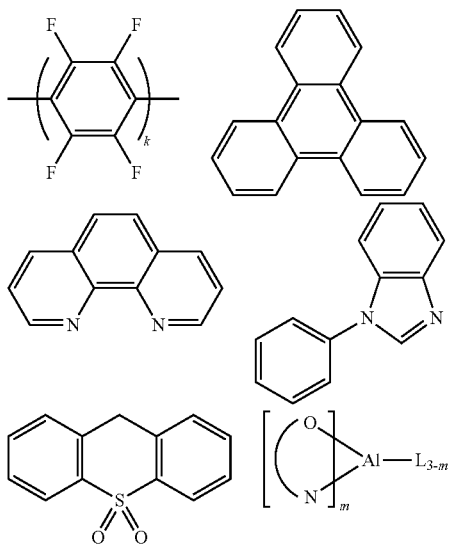

k is an integer from 0 to 20; L is an ancillary ligand, m is an integer from 1 to 3.

ETL:

Electron transport layer (ETL) may include a material capable of transporting electrons. Electron transport layer may be intrinsic (undoped), or doped. Doping may be used to enhance conductivity. Examples of the ETL material are not particularly limited, and any metal complexes or organic compounds may be used as long as they are typically used to transport electrons.

In one aspect, compound used in ETL contains at least one of the following groups in the molecule:

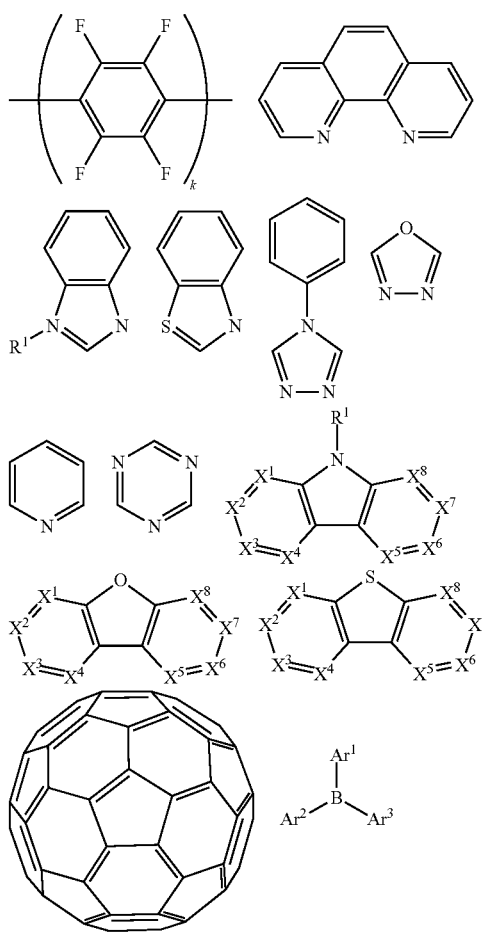

R$^1$ is selected from the group consisting of hydrogen, alkyl, alkoxy, amino, alkenyl, alkynyl, arylalkyl, heteroalkyl, aryl and heteroaryl, when it is aryl or heteroaryl, it has the similar definition as Ar's mentioned above.

Ar$^1$ to Ar$^3$ has the similar definition as Ar's mentioned above.

k is an integer from 0 to 20.

X$^1$ to X$^8$ is selected from CH or N.

In another aspect, the metal complexes used in ETL contains, but not limit to the following general formula:

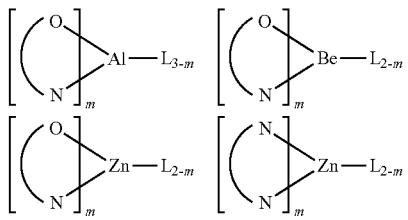

(O—N) or (N—N) is a bidentate ligand, having metal coordinated to atoms O, N or N, N; L is an ancillary ligand; m is an integer value from 1 to the maximum number of ligands that may be attached to the metal.

In any above-mentioned compounds used in each layer of the OLED device, the hydrogen atoms can be partially or fully deuterated.

In addition to and/or in combination with the materials disclosed herein, many hole injection materials, hole transporting materials, host materials, dopant materials, exiton/hole blocking layer materials, electron transporting and electron injecting materials may be used in an OLED. Non-limiting examples of the materials that may be used in an OLED in combination with materials disclosed herein are listed in Table XXX below. Table XXX lists non-limiting classes of materials, non-limiting examples of compounds for each class, and references that disclose the materials.

TABLE XXX

| MATERIAL | EXAMPLES OF MATERIAL | PUBLICATIONS |
|---|---|---|
| Hole injection materials | | |
| Phthalocyanine and porphryin compounds | 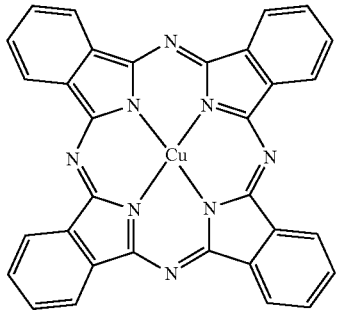 | Appl. Phys. Lett. 69, 2160 (1996) |
| Starburst triarylamines | 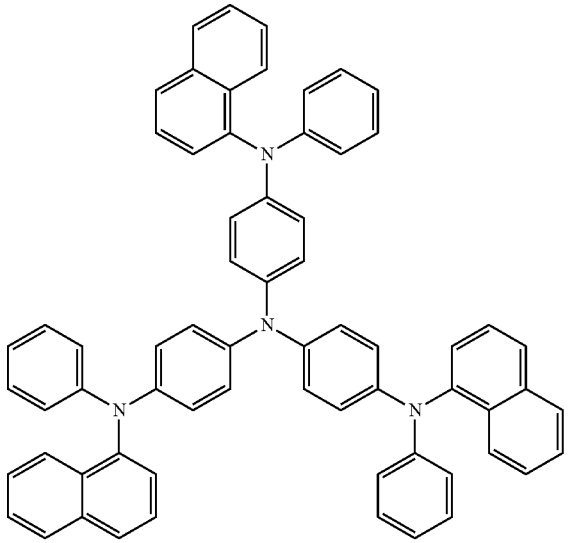 [SMILES: c1ccc(N(c2ccc(N(c3ccc(N(c4ccccc4)c4cccc5ccccc45)cc3)c3ccc(N(c4ccccc4)c4cccc5ccccc45)cc3)cc2)c2cccc3ccccc23)cc1] | J. Lumin. 72-74, 985 (1997) |
| CF$_x$ Fluorohydrocarbon polymer | $-\!\!\left[CH_xF_y\right]_n\!\!-$ | Appl. Phys. Lett. 78, 673 (2001) |
| Conducting polymers (e.g., PEDOT:PSS, polyaniline, polypthiophene) | 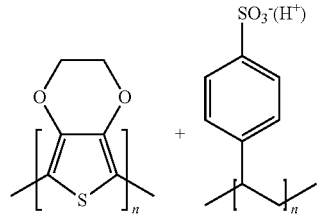 | Synth. Met. 87, 171 (1997) WO2007002683 |
| Phosphonic acid and sliane SAMs | 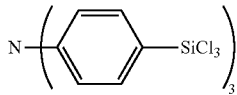 | US20030162053 |

| MATERIAL | EXAMPLES OF MATERIAL | PUBLICATIONS |
|---|---|---|
| Triarylamine or polythiophene polymers with conductivity dopants | | EP1725079A1 |
| Arylamines complexed with metal oxides such as molybdenum and tungsten oxides | | SID Symposium Digest, 37, 923 (2006) WO2009018009 |

TABLE XXX-continued
| MATERIAL | EXAMPLES OF MATERIAL | PUBLICATIONS |
| --- | --- | --- |
| p-type semiconducting organic complexes | 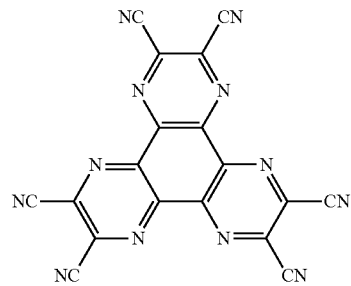 [SMILES: N#Cc1nc2c3nc(C#N)c(C#N)nc3c3nc(C#N)c(C#N)nc3c2nc1C#N] | US20020158242 |
| Metal organometallic complexes | 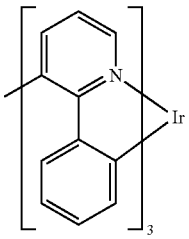 | US20060240279 |
| Cross-linkable compounds | 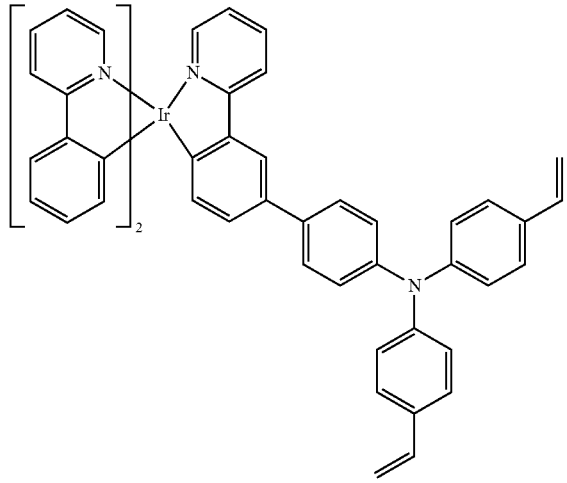 | US20080220265 |
| Hole transporting materials | | |
| Triarylamines (e.g., TPD, α-NPD) | 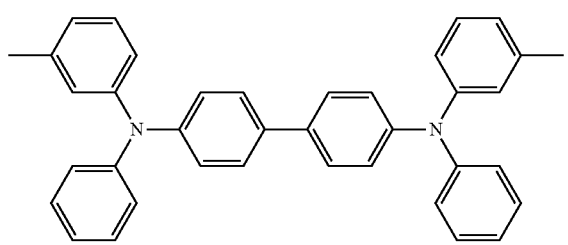 | Appl. Phys. Lett. 51, 913 (1987) |
| | 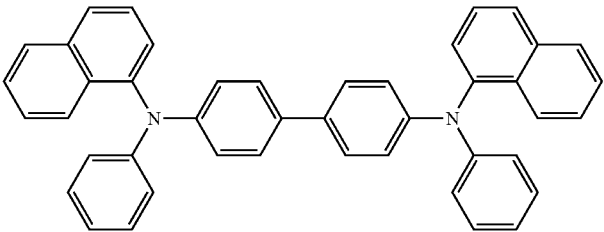 [SMILES: c1ccc(N(c2ccc(-c3ccc(N(c4ccccc4)c4cccc5ccccc45)cc3)cc2)c2cccc3ccccc23)cc1] | U.S. Pat. No. 5,061,569 |

TABLE XXX-continued
| MATERIAL | EXAMPLES OF MATERIAL | PUBLICATIONS |
|---|---|---|
| | 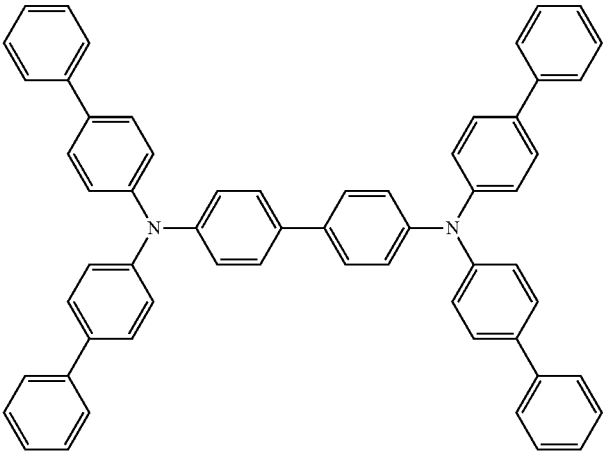 [SMILES: c1ccc(-c2ccc(N(c3ccc(-c4ccccc4)cc3)c3ccc(-c4ccc(N(c5ccc(-c6ccccc6)cc5)c5ccc(-c6ccccc6)cc5)cc4)cc3)cc2)cc1] | EP650955 |
| | 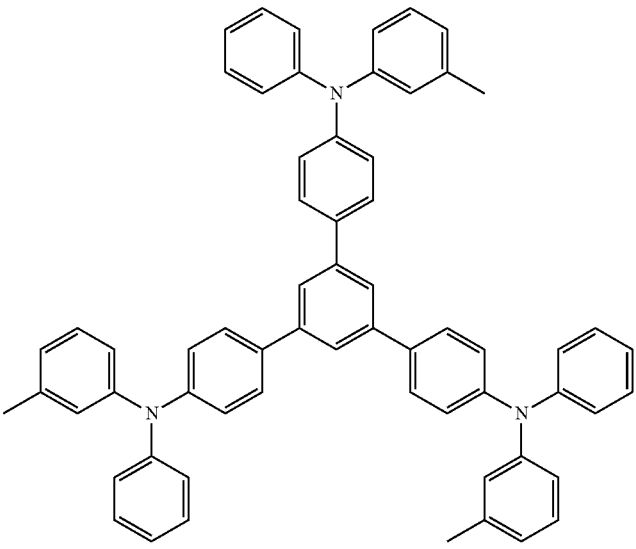 [SMILES: Cc1cccc(N(c2ccccc2)c2ccc(-c3cc(-c4ccc(N(c5ccccc5)c5cccc(C)c5)cc4)cc(-c4ccc(N(c5ccccc5)c5cccc(C)c5)cc4)c3)cc2)c1] | J. Mater. Chem. 3, 319 (1993) |
| | 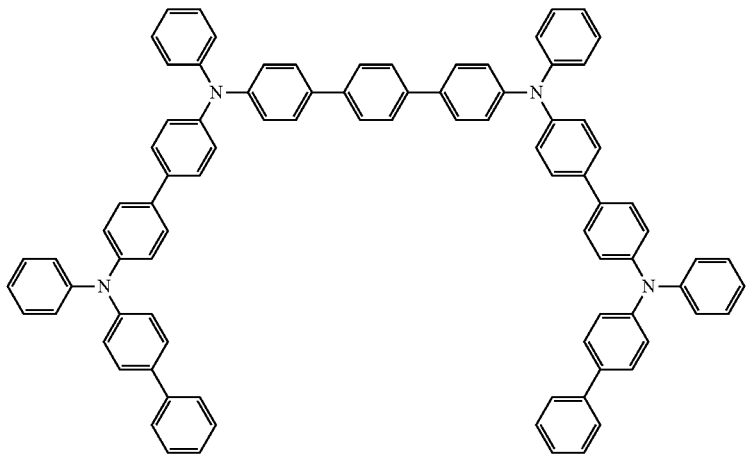 [SMILES: c1ccc(-c2ccc(N(c3ccccc3)c3ccc(-c4ccc(N(c5ccccc5)c5ccc(-c6ccc(-c7ccc(N(c8ccccc8)c8ccc(-c9ccc(N(c%10ccccc%10)c%10ccc(-c%11ccccc%11)cc%10)cc9)cc8)cc7)cc6)cc5)cc4)cc3)cc2)cc1] | Appl. Phys. Lett. 90, 183503 (2007) |

TABLE XXX-continued

| MATERIAL | EXAMPLES OF MATERIAL | PUBLICATIONS |
|---|---|---|
|  |  | Appl. Phys. Lett. 90, 183503 (2007) |
| Triaylamine on spirofluorene core |  | Synth. Met. 91, 209 (1997) |
| Arylamine carbazole compounds |  | Adv. Mater. 6, 677 (1994), US20080124572 |
| Triarylamine with (di)benzothiophene/ (di)benzofuran |  | US20070278938, US20080106190 |

TABLE XXX-continued

| MATERIAL | EXAMPLES OF MATERIAL | PUBLICATIONS |
| --- | --- | --- |
| Indolocarbazoles | | Synth. Met. 111, 421 (2000) |
| Isoindole compounds | | Chem. Mater. 15, 3148 (2003) |
| Metal carbene complexes | | US20080018221 |

Phosphorescent OLED host materials
Red hosts

| | | |
| --- | --- | --- |
| Arylcarbazoles | | Appl. Phys. Lett. 78, 1622 (2001) |

TABLE XXX-continued

| MATERIAL | EXAMPLES OF MATERIAL | PUBLICATIONS |
| --- | --- | --- |
| Metal 8-hydroxy-quinolates (e.g., Alq$_3$, BAlq) | | Nature 395, 151 (1998) |
| | | US20060202194 |
| | | WO2005014551 |
| | | WO2006072002 |
| Metal phenoxy-benzothiazole compounds | | Appl. Phys. Lett. 90, 123509 (2007) |
| Conjugated oligomers and polymers (e.g., polyfluorene) | | Org. Electron. 1, 15 (2000) |
| Aromatic fused rings | | WO2009066779, WO2009066778, WO2009063833, US20090045731, US20090045730, WO2009008311, US20090008605, US20090009065 |

TABLE XXX-continued

| MATERIAL | EXAMPLES OF MATERIAL | PUBLICATIONS |
| --- | --- | --- |
| Zinc complexes | | WO2009062578 |или
| Green hosts | | |
| Arylcarbazoles | | Appl. Phys. Lett. 78, 1622 (2001) |
| | | US20030175553 |
| | | WO2001039234 |
| Aryltriphenylene compounds | | US20060280965 |

TABLE XXX-continued
| MATERIAL | EXAMPLES OF MATERIAL | PUBLICATIONS |
|---|---|---|
| | 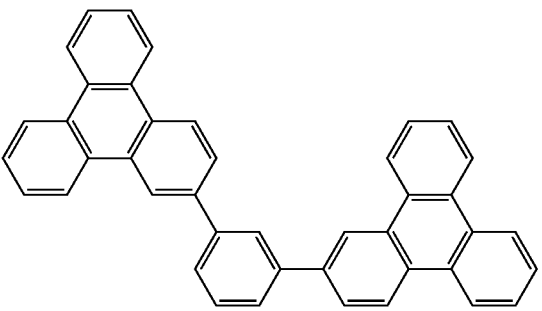 [SMILES: c1cc(-c2ccc3c4ccccc4c4ccccc4c3c2)cc(-c2ccc3c4ccccc4c4ccccc4c3c2)c1] | US20060280965 |
| | 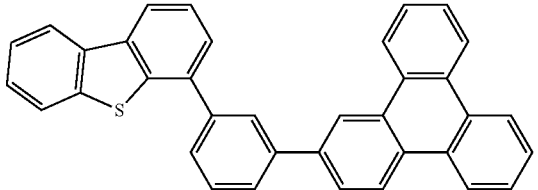 [SMILES: c1cc(-c2ccc3c4ccccc4c4ccccc4c3c2)cc(-c2cccc3c2sc2ccccc23)c1] | WO2009021126 |
| Donor acceptor type molecules | 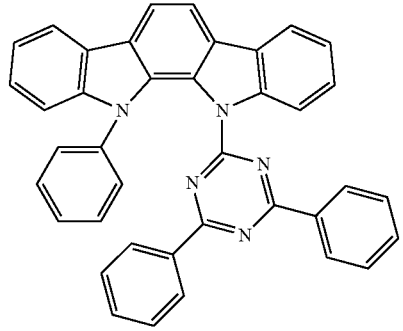 [SMILES: c1ccc(-c2nc(-c3ccccc3)nc(-n3c4ccccc4c4ccc5c6ccccc6n(-c6ccccc6)c5c43)n2)cc1] | WO2008056746 |
| Aza-carbazole/ DBT/DBF | 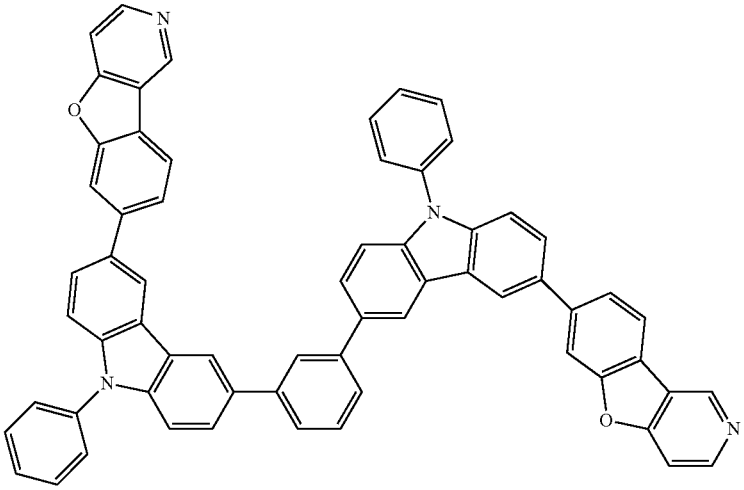 [SMILES: c1ccc(-n2c3ccc(-c4cccc(-c5ccc6c(c5)c5cc(-c7ccc8c(c7)oc7ccncc78)ccc5n6-c5ccccc5)c4)cc3c3cc(-c4ccc5c(c4)oc4ccncc45)ccc32)cc1] | JP2008074939 |
| Polymers (e.g., PVK) | 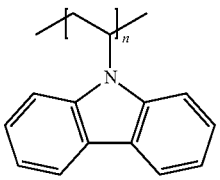 | Appl. Phys. Lett. 77, 2280 (2000) |

TABLE XXX-continued

| MATERIAL | EXAMPLES OF MATERIAL | PUBLICATIONS |
| --- | --- | --- |
| Spirofluorene compounds | | WO2004093207 |
| Metal phenoxy-benzooxazole compounds | | WO2005089025 |
| | | WO2006132173 |
| | | JP200511610 |
| Spirofluorene-carbazole compounds | | JP2007254297 |

US 8,927,308 B2
TABLE XXX-continued
| MATERIAL | EXAMPLES OF MATERIAL | PUBLICATIONS |
|---|---|---|
| | 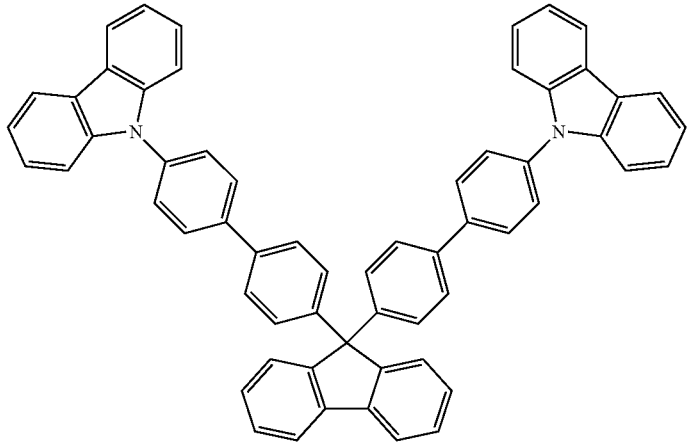 [SMILES: c1ccc2c(c1)-c1ccccc1C2(c1ccc(-c2ccc(-n3c4ccccc4c4ccccc43)cc2)cc1)c1ccc(-c2ccc(-n3c4ccccc4c4ccccc43)cc2)cc1] | JP2007254297 |
| Indolocabazoles | 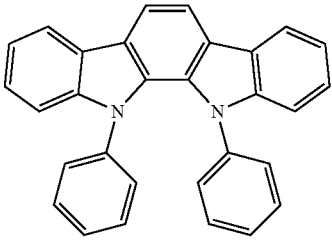 [SMILES: c1ccc(-n2c3ccccc3c3ccc4c5ccccc5n(-c5ccccc5)c4c32)cc1] | WO2007063796 |
| | 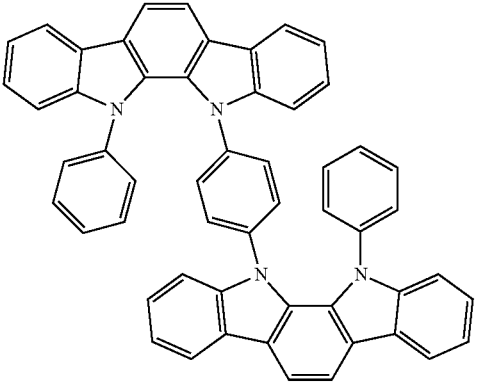 [SMILES: c1ccc(-n2c3ccccc3c3ccc4c5ccccc5n(-c5ccc(-n6c7ccccc7c7ccc8c9ccccc9n(-c9ccccc9)c8c76)cc5)c4c32)cc1] | WO2007063754 |
| 5-member ring electron deficient heterocycles (e.g., triazole, oxadiazole) | 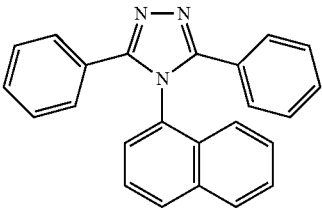 [SMILES: c1ccc(-c2nnc(-c3ccccc3)n2-c2cccc3ccccc23)cc1] | J. Appl. Phys. 90, 5048 (2001) |
| | 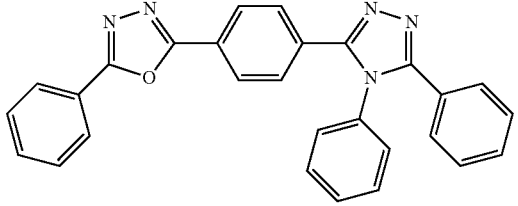 [SMILES: c1ccc(-c2nnc(-c3ccc(-c4nnc(-c5ccccc5)n4-c4ccccc4)cc3)o2)cc1] | WO2004107822 |

TABLE XXX-continued

| MATERIAL | EXAMPLES OF MATERIAL | PUBLICATIONS |
| --- | --- | --- |
| Tetraphenylene complexes | | US20050112407 |
| Metal phenoxypyridine compounds | | WO2005030900 |
| Metal coordination complexes (e.g., Zn, Al with N^N ligands) | | US20040137268, US20040137267 |//
| Blue hosts | | |
| Arylcarbazoles | | Appl. Phys. Lett, 82, 2422 (2003) |
| | | US20070190359 |

TABLE XXX-continued
| MATERIAL | EXAMPLES OF MATERIAL | PUBLICATIONS |
|---|---|---|
| Dibenzo-thiophene/ Dibenzo-furan-carbazole compounds | 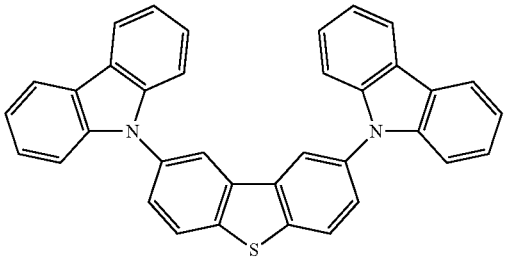 [SMILES: c1ccc2c(c1)c1ccccc1n2-c1ccc2sc3ccc(-n4c5ccccc5c5ccccc54)cc3c2c1] | WO2006114966, US20090167162 |
| | 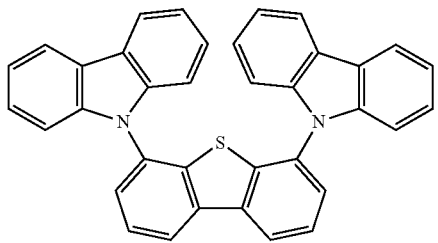 [SMILES: c1cc(-n2c3ccccc3c3ccccc32)c2sc3c(-n4c5ccccc5c5ccccc54)cccc3c2c1] | US20090167162 |
| | 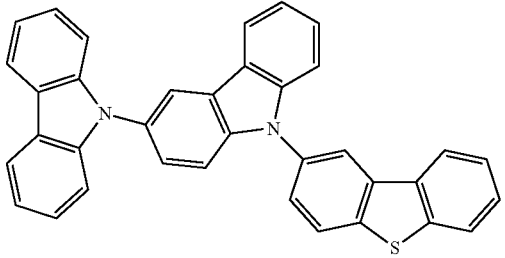 [SMILES: c1ccc2c(c1)sc1ccc(-n3c4ccccc4c4cc(-n5c6ccccc6c6ccccc65)ccc43)cc12] | WO2009086028 |
| | 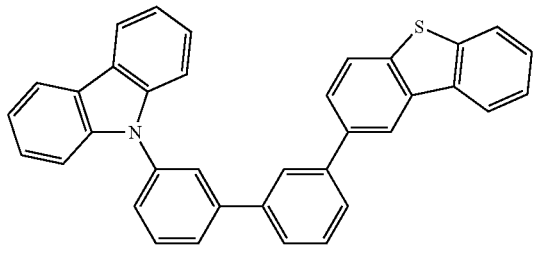 [SMILES: c1cc(-c2cccc(-n3c4ccccc4c4ccccc43)c2)cc(-c2ccc3sc4ccccc4c3c2)c1] | US20090030202, US20090017330 |
| Silicon aryl compounds | 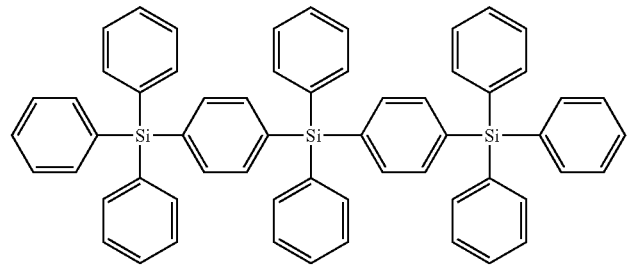 [SMILES: c1ccc([Si](c2ccccc2)(c2ccccc2)c2ccc([Si](c3ccccc3)(c3ccccc3)c3ccc([Si](c4ccccc4)(c4ccccc4)c4ccccc4)cc3)cc2)cc1] | US20050238919 |
| | 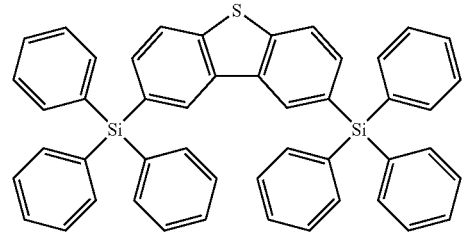 [SMILES: c1ccc([Si](c2ccccc2)(c2ccccc2)c2ccc3sc4ccc([Si](c5ccccc5)(c5ccccc5)c5ccccc5)cc4c3c2)cc1] | WO2009003898 |

TABLE XXX-continued

| MATERIAL | EXAMPLES OF MATERIAL | PUBLICATIONS |
|---|---|---|
| Silicon/Germanium aryl compounds | | EP2034538A |
| Aryl benzoyl ester | | WO2006100298 |
| High triplet metal organometallic complex | | U.S. Pat. No. 7,154,114 |

Phosphorescent dopants
Red dopants

| | | |
|---|---|---|
| Heavy metal porphyrins (e.g., PtOEP) | | Nature 395, 151 (1998) |
| Iridium (III) organometallic complexes | | Appl. Phys. Lett. 78, 1622 (2001) |

TABLE XXX-continued

| MATERIAL | EXAMPLES OF MATERIAL | PUBLICATIONS |
|---|---|---|
| | | US2006835469 |
| | | US2006835469 |
| | | US20060202194 |
| | | US20060202194 |
| | | US20070087321 |

| MATERIAL | EXAMPLES OF MATERIAL | PUBLICATIONS |
|---|---|---|
| | 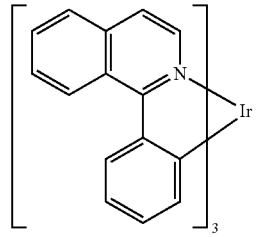 | US20070087321 |
| | | Adv. Mater. 19, 739 (2007) |
| | | WO2009100991 |
| | | WO2008101842 |
| Platinum (II) organometallic complexes | 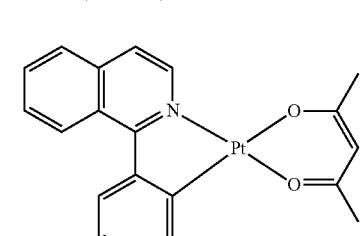 | WO2003040257 |

TABLE XXX-continued

| MATERIAL | EXAMPLES OF MATERIAL | PUBLICATIONS |
| --- | --- | --- |
| Osminum (III) complexes | | Chem. Mater. 17, 3532 (2005) |
| Ruthenium (II) complexes | | Adv. Mater. 17, 1059 (2005) |
| Rhenium (I), (II), and (III) complexes | | US20050244673 |

Green dopants

| MATERIAL | EXAMPLES OF MATERIAL | PUBLICATIONS |
| --- | --- | --- |
| Iridium (III) organometallic complexes | and its derivatives | Inorg. Chem. 40, 1704 (2001) |
| | | US20020034656 |

TABLE XXX-continued
| MATERIAL | EXAMPLES OF MATERIAL | PUBLICATIONS |
|---|---|---|
| | 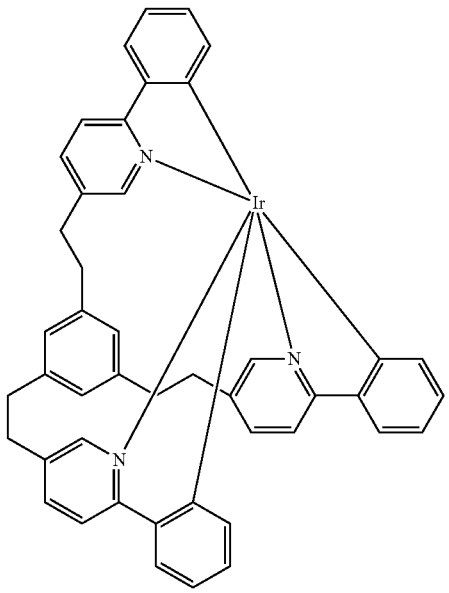 | U.S. Pat. No. 7,332,232 |
| | 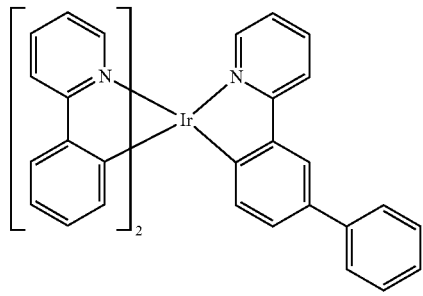 | US20090108737 |
| | 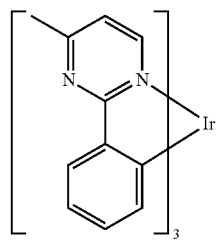 | US20090039776 |
| | 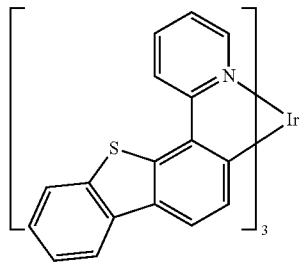 | U.S. Pat. No. 6,921,915 |

TABLE XXX-continued

| MATERIAL | EXAMPLES OF MATERIAL | PUBLICATIONS |
|---|---|---|
| | | U.S. Pat. No. 6,687,266 |
| | | Chem. Mater. 16, 2480 (2004) |
| | | US20070190359 |
| | | US 20060008670 JP2007123392 |
| | | Adv. Mater. 16, 2003 (2004) |

TABLE XXX-continued

| MATERIAL | EXAMPLES OF MATERIAL | PUBLICATIONS |
|---|---|---|
| | | Angew. Chem. Int. Ed. 2006, 45, 7800 |
| | | WO2009050290 |
| | | US20090165846 |
| | | US20080015355 |
| Monomer for polymeric metal organometallic compounds | | U.S. Pat. No. 7,250,226, U.S. Pat. No. 7,396,598 |

TABLE XXX-continued
| MATERIAL | EXAMPLES OF MATERIAL | PUBLICATIONS |
|---|---|---|
| Pt (II) organo-metallic complexes, including polydentated ligands | 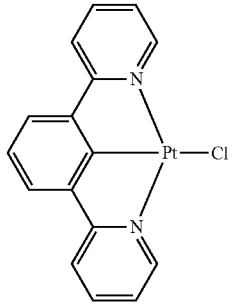 | Appl. Phys. Lett. 86, 153505 (2005) |
| | 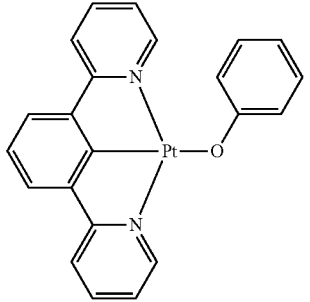 | Appl. Phys. Lett. 86, 153505 (2005) |
| | 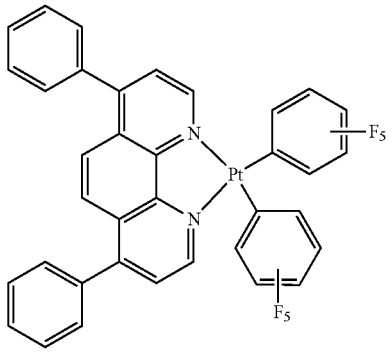 | Chem. Lett. 34, 592 (2005) |
| | 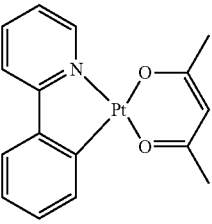 | WO2002015645 |
| | 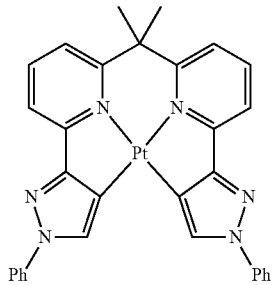 | US20060263635 |

TABLE XXX-continued
| MATERIAL | EXAMPLES OF MATERIAL | PUBLICATIONS |
|---|---|---|
| Cu complexes | 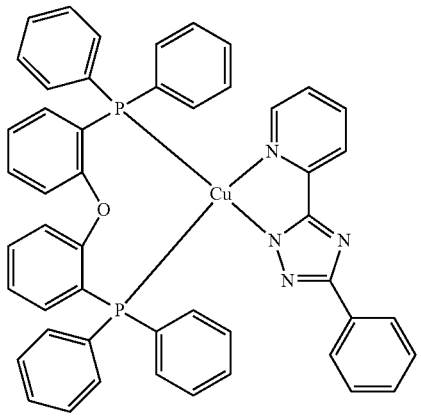 | WO2009000673 |
| Gold complexes | 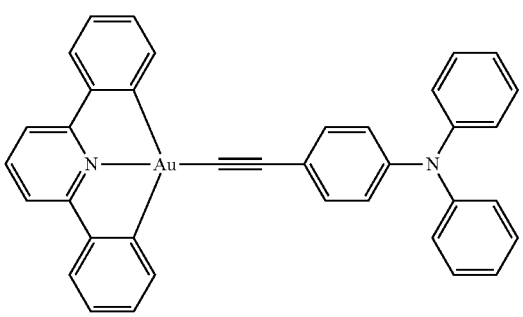 | Chem. Commun. 2906 (2005) |
| Rhenium (III) complexes | 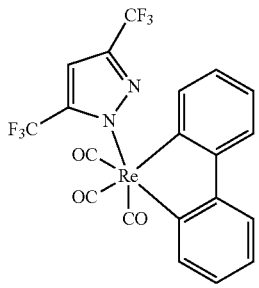 | Inorg. Chem. 42, 1248 (2003) |
| Deuterated organometallic complexes | 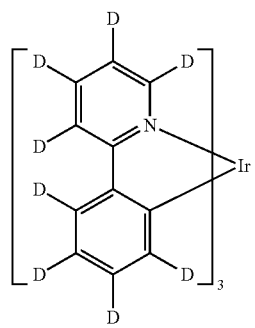 | US20030138657 |

| MATERIAL | EXAMPLES OF MATERIAL | PUBLICATIONS |
|---|---|---|
| Organometallic complexes with two or more metal centers | 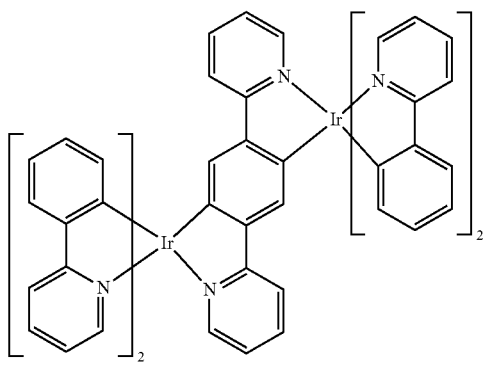 | US20030152802 |
| | 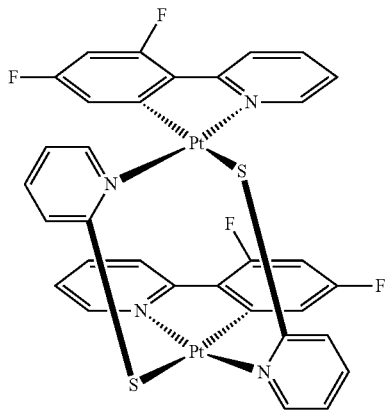 | U.S. Pat. No. 7,090,928 |
| Blue dopants | | |
| Iridium (III) organometallic complexes | 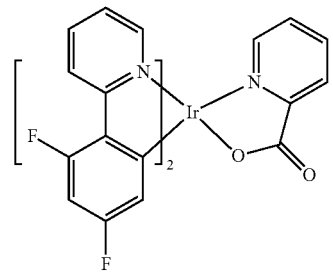 | WO2002002714 |
| | 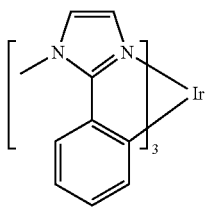 | WO2006009024 |
| | 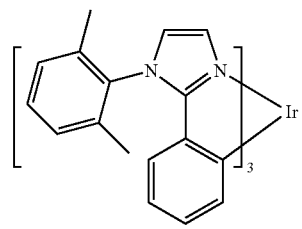 | US20060251923 |

TABLE XXX-continued

| MATERIAL | EXAMPLES OF MATERIAL | PUBLICATIONS |
|---|---|---|
| | | U.S. Pat. No. 7,393,599, WO2006056418, US20050260441, WO2005019373 |
| | | U.S. Pat. No. 7,534,505 |
| | | U.S. Pat. No. 7,445,855 |
| | | US20070190359, US20080297033 |
| | | U.S. Pat. No. 7,338,722 |
| | | US20020134984 |

TABLE XXX-continued
| MATERIAL | EXAMPLES OF MATERIAL | PUBLICATIONS |
|---|---|---|
| | 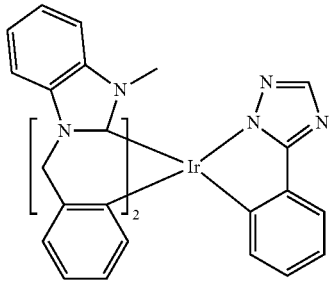 | Angew. Chem. Int. Ed. 47, 1 (2008) |
| | 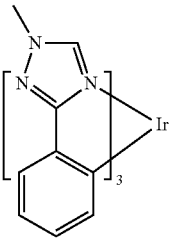 | Chem. Mater. 18, 5119 (2006) |
| | 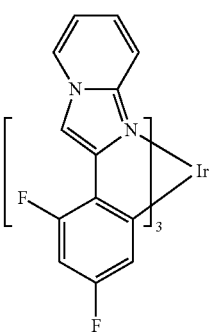 | Inorg. Chem. 46, 4308 (2007) |
| | 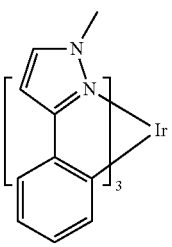 | WO2005123873 |
| | 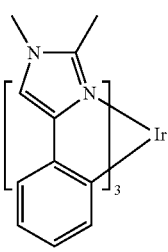 | WO2005123873 |
| | 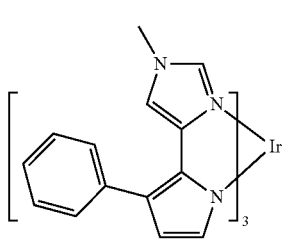 | WO2007004380 |

TABLE XXX-continued
| MATERIAL | EXAMPLES OF MATERIAL | PUBLICATIONS |
|---|---|---|
| | 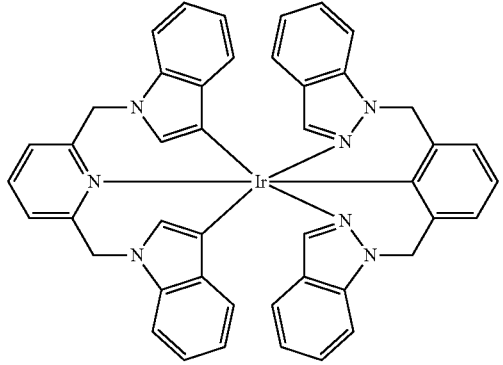 | WO2006082742 |
| Osmium (II) complexes | 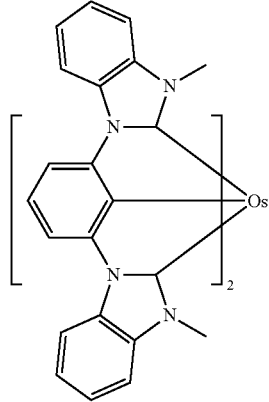 | U.S. Pat. No. 7,279,704 |
| | 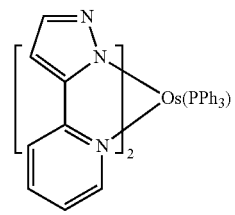 | Organometallics 23, 3745 (2004) |
| Gold complexes | 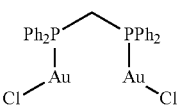 | Appl. Phys. Lett. 74, 1361 (1999) |
| Platinum (II) complexes | 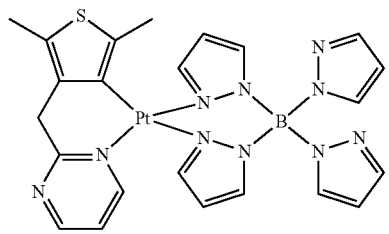 | WO2006098120, WO2006103874 |

TABLE XXX-continued

| MATERIAL | EXAMPLES OF MATERIAL | PUBLICATIONS |
|---|---|---|
| Exciton/hole blocking layer materials | | |
| Bathocuprine compounds (e.g., BCP, BPhen) | 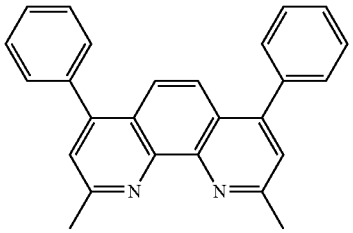 [SMILES: Cc1cc(-c2ccccc2)c2ccc3c(-c4ccccc4)cc(C)nc3c2n1] | Appl. Phys. Lett. 75, 4 (1999) |
| | 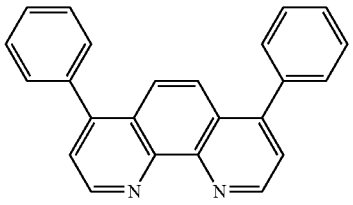 [SMILES: c1ccc(-c2ccnc3c2ccc2c(-c4ccccc4)ccnc23)cc1] | Appl. Phys. Lett. 79, 449 (2001) |
| Metal 8-hydroxy-quinolates (e.g., BAlq) | 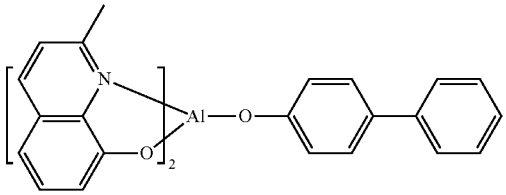 | Appl. Phys. Lett. 81, 162 (2002) |
| 5-member ring electron deficient heterocycles such as triazole, oxadiazole, imidazole, benzoimidazole | 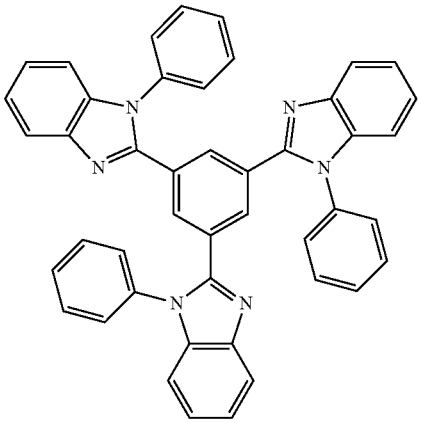 [SMILES: c1ccc(-n2c(-c3cc(-c4nc5ccccc5n4-c4ccccc4)cc(-c4nc5ccccc5n4-c4ccccc4)c3)nc3ccccc32)cc1] | Appl. Phys. Lett. 81, 162 (2002) |
| Triphenylene compounds | 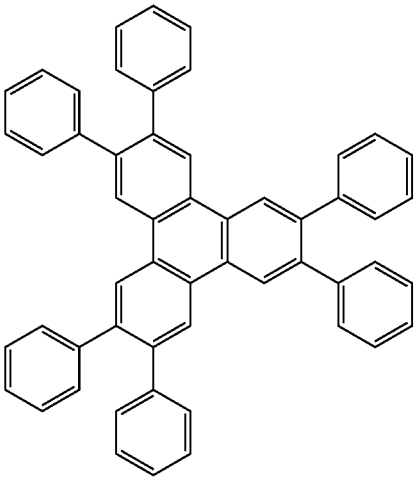 [SMILES: c1ccc(-c2cc3c4cc(-c5ccccc5)c(-c5ccccc5)cc4c4cc(-c5ccccc5)c(-c5ccccc5)cc4c3cc2-c2ccccc2)cc1] | US20050025993 |

TABLE XXX-continued

| MATERIAL | EXAMPLES OF MATERIAL | PUBLICATIONS |
| --- | --- | --- |
| Fluorinated aromatic compounds | | Appl. Phys. Lett. 79, 156 (2001) |
| Phenothiazine-S-oxide | | WO2008132085 |

Electron transporting materials

| | | |
| --- | --- | --- |
| Anthracene-benzoimidazole compounds | | WO2003060956 |

TABLE XXX-continued

| MATERIAL | EXAMPLES OF MATERIAL | PUBLICATIONS |
| --- | --- | --- |
|  |  | US20090179554 |
| Aza triphenylene derivatives |  | US20090115316 |
| Anthracene-benzothiazole compounds |  | Appl. Phys. Lett. 89, 063504 (2006) |
| Metal 8-hydroxy-quinolates (e.g., Alq$_3$, Zrq$_4$) |  | Appl. Phys. Lett. 51, 913 (1987) U.S. Pat. No. 7,230,107 |
| Metal hydroxy-benoquinolates |  | Chem. Lett. 5, 905 (1993) |
| Bathocuprine compounds such as BCP, BPhen, etc |  | Appl. Phys. Lett. 91, 263503 (2007) |

TABLE XXX-continued

| MATERIAL | EXAMPLES OF MATERIAL | PUBLICATIONS |
| --- | --- | --- |
| | | Appl. Phys. Lett. 79, 449 (2001) |
| 5-member ring electron deficient heterocycles (e.g., triazole, oxadiazole, imidazole, benzoimidazole) | | Appl. Phys. Lett. 74, 865 (1999) |
| | | Appl. Phys. Lett. 55, 1489 (1989) |
| | | Jpn. J. Apply. Phys. 32, L917 (1993) |
| Silole compounds | | Org. Electron, 4, 113 (2003) |
| Arylborane compounds | | J. Am. Chem. Soc. 120, 9714 (1998) |

TABLE XXX-continued

| MATERIAL | EXAMPLES OF MATERIAL | PUBLICATIONS |
|---|---|---|
| Fluorinated aromatic compounds | 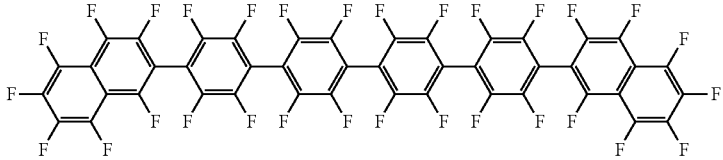 [SMILES: Fc1c(F)c(-c2c(F)c(F)c(-c3c(F)c(F)c4c(F)c(F)c(F)c(F)c4c3F)c(F)c2F)c(F)c(F)c1-c1c(F)c(F)c(-c2c(F)c(F)c(-c3c(F)c(F)c4c(F)c(F)c(F)c(F)c4c3F)c(F)c2F)c(F)c1F] | J. Am. Chem. Soc. 122, 1832 (2000) |
| Fullerene (e.g., C60) | 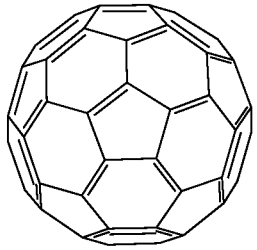 | US20090101870 |
| Triazine complexes | 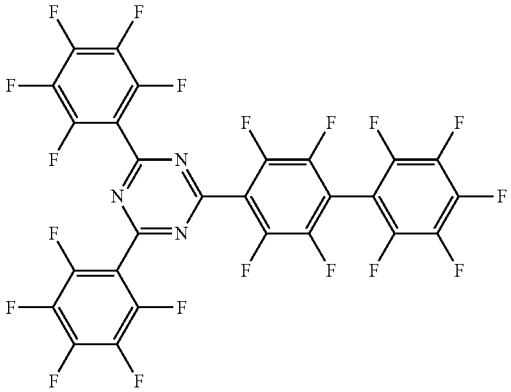 [SMILES: Fc1c(F)c(F)c(-c2nc(-c3c(F)c(F)c(F)c(F)c3F)nc(-c3c(F)c(F)c(-c4c(F)c(F)c(F)c(F)c4F)c(F)c3F)n2)c(F)c1F] | US20040036077 |
| Zn (N^N) complexes | 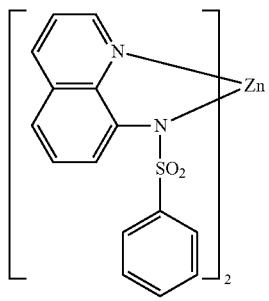 | U.S. Pat. No. 6,528,187 |

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore includes variations from the particular examples and preferred embodiments described herein, as will be apparent to one of skill in the art. It is understood that various theories as to why the invention works are not intended to be limiting.

The invention claimed is:

1. A method of manufacturing a light emitting panel with a plurality of active areas and a plurality of bus lines, the method comprising:

determining equipotential lines in the absence of bus lines, on at least one electrode between at least one pair of electrode contacts with the same electrical polarity;

determining an arrangement for a plurality of bus lines between the at least one pair of electrode contacts, the plurality of bus lines arranged to run perpendicular to the determined equipotential lines; and forming the plurality of bus lines in electrical contact with the at least one electrode according to the determined arrangement.

2. The method of claim 1, wherein the at least one pair of electrode contacts includes a pair of anode contacts, the at least one electrode is an anode, and the plurality of bus lines are arranged between the pair of anode contacts.

3. The method of claim 1, wherein the at least one pair of electrode contacts includes a pair of cathode contacts, the at least one electrode is a cathode, and the plurality of bus lines are arranged between the pair of cathode contacts.

4. The method of claim 1, wherein:

a panel area is rectangular;

the at least one pair of electrode contacts includes contacts of the same polarity on each side of the panel area;

the plurality of bus lines are arranged such that a first set of the bus lines closely run perpendicular to one pair of opposing sides of the panel area, and a second set of the bus lines closely run perpendicular to the other pair of opposing sides of the panel area; and the first set of the bus lines and the second set of the bus lines are in electrical contact with the at least one electrode.

5. The method of claim 1, wherein:

a panel area is rectangular;

a first pair of opposing sides of the panel area have a relatively long length compared to a second pair of opposing sides of the panel area;

the at least one pair of electrode contacts includes contacts of the same polarity on at least the first pair of opposing sides of the panel area; and the plurality of bus lines are arranged to closely run only perpendicular to the first pair of opposing sides of the panel area.

6. The method of claim 1, wherein:

a panel area includes a plurality of rectangular active areas;

first pairs of opposing sides of the active areas have a relatively long length compared to second pairs of opposing sides of the active areas; and the active areas are arranged such that the first pair of opposing sides of the active areas closely run parallel to the plurality of bus lines.

7. The method of claim 1, wherein:

a panel area comprises a circular shape;

the equipotential lines are concentric; and the bus lines are arranged to run along radii extending from an edge of the circular shape to a center of the circular shape.

8. The method of claim 1, wherein a footprint of the outer dimensions of the at least one pair of electrode contacts is equal to or larger than a perimeter footprint of a panel area.

9. The method of claim 1, wherein:

the at least one electrode includes a first electrode and a second electrode;

equipotential lines are determined for the first electrode and the second electrode;

the at least one pair of electrode contacts includes a first set of electrode contacts for the first electrode and a second set of electrode contacts for the second electrode;

wherein the first electrode is between the first set of electrode contacts and the second electrode is between the second set of electrode contacts;

a first set of the plurality of bus lines are arranged between the first set of electrode contacts and a second set of the plurality of bus lines are arranged between the second set of electrode contacts; and the first set of bus lines are formed in electrical contact with the first electrode and the second set of bus lines are formed in electrical contact with the second electrode.

10. The method of claim 9, wherein the first electrode is anode and the second electrode is cathode.

11. The method of claim 1, wherein:

a panel area is rectangular;

the at least one pair of electrode contacts includes a first set of electrode contacts of the same electrical polarity on opposite sides of the panel area; and the plurality of bus lines are arranged in electrical contact with the at least one electrode to closely run perpendicular to the first set of electrode contacts.

12. The method of claim 11, wherein:

the at least one electrode includes a first electrode and a second electrode, the second electrode separate, and opposite electrical polarity, from the first electrode;

the equipotential lines are determined for the first electrode and the second electrode;

the at least one pair of electrode contacts includes the first set of electrode contacts, for the first electrode, and a second set of electrode contacts, for the second electrode;

a first set of the plurality of bus lines are arranged between the first set of electrode contacts;

a second set of the plurality of bus lines are arranged between the second set of electrode contacts;

the first set of bus lines are formed in electrical contact with the first electrode and perpendicular to the first set of electrode contacts; and the second set of bus lines are formed in electrical contact with the second electrode and perpendicular to the second set of electrode contacts.

13. The method of claim 11, wherein the first set of electrode contacts are anode contacts.

14. The method of claim 11, wherein the first set of electrode contacts are cathode contacts.

15. The method of claim 1, further comprising calculating a minimum bus line width for the plurality bus lines based on a given working condition, wherein the plurality of bus lines are formed according to the calculated minimum bus line width.

16. The method of claim 15, wherein the working condition includes a target luminous emittance, and one or the combination of two of a minimum Uniformity, a minimum Fill Factor and a maximum Power Loss.

17. The method of claim 16, wherein the calculating the minimum bus line width further comprises:

providing device current density-voltage-luminance (JVL) data of an equivalent small area pixel;

providing horizontal dimensions of the panel area;

providing resistivity values and thickness of bus line material and the electrode onto which the bus line is disposed; and optimizing values for at least one of a maximum Fill Factor (FF), a maximum luminance uniformity (U) and a minimum power loss (PL) for the target working condition.

18. A method of manufacturing a light emitting panel, wherein the panel area comprises a plurality of active areas and a plurality of bus lines, the method comprising:

providing horizontal dimensions of the panel area;

providing device current density-voltage-luminance (JVL) data of an equivalent small area pixel;

providing resistivity values and thickness of bus line material and an electrode onto which the bus line is disposed;

providing a target working condition for the light emitting panel;

calculating at least one width of metal bus lines based on the horizontal dimensions of the panel area, device JVL data, resistivity and thickness of bus line material and the electrode onto which the bus line is disposed, and the target working condition; and forming the plurality of bus lines according to the at least one calculated value.

19. The method of claim 18, wherein the working condition includes a target luminous emittance and one or the combination of two of a minimum uniformity, a minimum Fill Factor and a maximum power loss.

20. The method of claim 18, wherein the calculating at least one width of metal bus lines comprises solving for a Fill Factor (FF)>70% and a Luminance Uniformity (U)>80%.

21. The method of claim 18, wherein the light emitting panel has a panel area >50 cm² and the calculating at least one width of metal bus lines comprises solving for a Fill Factor (FF)>80% and a Luminance Uniformity (U)>90%.

22. The method of claim 18, wherein the light emitting panel has a panel area >50 cm² and the calculating at least one width of metal bus lines comprises solving for a Fill Factor (FF)>90% and a Luminance Uniformity (U)>90%.

23. The method of claim 18, wherein the panel area is rectangular shaped with length X and width Y, the method further comprising solving for Fill Factor (FF) according to the equation:

$$FF = \frac{X \cdot Y - \sum_{m=1}^{n} A_m}{X \cdot Y},$$

wherein, $A_m$ is the non-active surface area within the panel area caused by the presence of each bus line segment.

24. The method of claim 18, wherein, with a bus line running along a y direction, each segment has a current I(y), resistivity p(y), thickness t(y), and width $W_x(y)$, and an angle θ(y) with respect to y, and the calculating the at least one width of metal bus lines comprises calculating the width along an x direction ($W_x$) and solving for a potential drop (ΔV) along the bus line of length L according to the equation:

$$\Delta V = \int_0^L \rho(y) \frac{|\vec{I}(y)|}{\cos^2\theta(y)|\vec{W}_x(y)|t(y)} |dy|.$$

25. The method of claim 18, wherein the bus lines are formed to run substantially perpendicular to the equipotential lines.

26. The method of claim 18, wherein:
the panel area is rectangular and includes at least one pair of electrode contacts of the same polarity on each side of the panel area;
the plurality of bus lines are arranged such that a first set of the bus lines closely run perpendicular to one pair of opposing sides of the panel area, and a second set of the bus lines closely run perpendicular to the other pair of opposing sides of the panel area; and
the first set of the bus lines and the second set of the bus lines are in electrical contact with the at least one electrode.

27. The method of claim 18, wherein:
the panel area is rectangular and includes at least one pair of electrode contacts of the same polarity;
a first pair of opposing sides of the panel area have a relatively long length compared to a second pair of opposing sides of the panel area;
the at least one pair of electrode contacts includes contacts of the same polarity on at least the first pair of opposing sides of the panel area; and
the plurality of bus lines are arranged to closely run only perpendicular to the first pair of opposing sides of the panel area.

28. The method of claim 18, wherein:
the panel area includes a plurality of rectangular active areas;
first pairs of opposing sides of the active areas have a relatively long length compared to second pairs of opposing sides of the active areas; and
the active areas are arranged such that the first pair of opposing sides of the active areas closely run parallel to the plurality of bus lines.

29. The method of claim 18, wherein the panel area operates at luminous emittance greater than 8,000 lm/m² inclusive of light extraction enhancement.

30. The method of claim 18, wherein a footprint of outer dimensions of at least one pair of electrode contacts connected to the bus lines is equal to or larger than a perimeter footprint of the panel area.

31. The method of claim 18, wherein the calculating at least one width of metal bus lines includes providing a length of at least one active area (S) and a height of this one active area (H).

32. The method of claim 31, wherein the calculating at least one width of metal bus lines includes calculating at least one of a width of metal bus lines along an x direction ($W_x$) and width of metal bus lines along a y direction ($W_y$), based on S, H, horizontal dimensions of the panel area, device JVL data, resistivity and thickness of bus line material and the electrode onto which the bus line is disposed, and the target working condition.

\* \* \* \* \*